United States Patent [19]
Baseman et al.

[11] Patent Number: 5,346,518
[45] Date of Patent: Sep. 13, 1994

[54] VAPOR DRAIN SYSTEM

[75] Inventors: Robert J. Baseman, Brewster, N.Y.; Charles A. Brown, Los Gatos, Calif.; Benjamin N. Eldridge, Hopewell Junction, N.Y.; Laura B. Rothman, South Kent, Conn.; Herman R. Wendt, San Jose, Calif.; James T. Yeh, Katonah; Arthur R. Zingher, White Plains, both of N.Y.

[73] Assignee: International Business Machines Corporation, Armonk, N.Y.

[21] Appl. No.: 35,999

[22] Filed: Mar. 23, 1993

[51] Int. Cl.⁵ .................. B65B 5/00; B65D 81/26; B65D 85/62; F17C 11/00
[52] U.S. Cl. .................. 55/267; 55/385.1; 55/385.6; 55/485; 206/204; 206/334; 360/97.02
[58] Field of Search ............ 55/267, 385.1, 385.4, 55/385.6, 485, 486, 527; 96/154; 206/204, 205, 213.1, 334; 360/97.02, 97.03

[56] References Cited

U.S. PATENT DOCUMENTS

| | | | |
|---|---|---|---|
| 3,631,423 | 12/1971 | Groom | 360/97.02 |
| 3,710,540 | 1/1973 | Stansell | 55/473 |
| 3,846,835 | 11/1974 | Horovitz et al. | 360/98.08 |
| 4,339,777 | 7/1982 | Gruczelak | 360/97.02 |
| 4,489,356 | 12/1984 | Farmer | 360/97.03 |
| 4,510,541 | 4/1985 | Sasamoto | 360/97.02 |
| 4,532,970 | 8/1985 | Tullis et al. | 141/98 |
| 4,534,389 | 8/1985 | Tullis | 141/98 |
| 4,581,668 | 4/1986 | Campbell | 360/97.02 |
| 4,620,248 | 10/1986 | Gitzendanner | 360/97.02 |
| 4,666,479 | 5/1987 | Shoji | 55/527 |
| 4,684,510 | 8/1987 | Harkins | 423/210 |
| 4,721,207 | 1/1988 | Kikuchi | 206/334 |
| 4,739,882 | 4/1988 | Parikh et al. | 206/454 |
| 4,772,300 | 9/1988 | Cullen et al. | 96/7 |
| 4,853,013 | 8/1989 | Rio et al. | 96/6 |
| 5,030,260 | 7/1991 | Beck et al. | 96/139 |
| 5,034,835 | 7/1991 | Yokoyama | 360/97.02 |
| 5,047,348 | 9/1991 | Stinson | 435/311 |
| 5,057,217 | 10/1991 | Lutz et al. | 210/346 |

FOREIGN PATENT DOCUMENTS 0458528  7/1992  European Pat. Off. .

OTHER PUBLICATIONS

"Expanded Teflon Filter Helps Build Denser, Faster Disk Drives", Electronic Design May 25, 1989, p. 30.
B. L. Baker, "Molecular Adsorption Scrubs Air Clean", Design News, Nov. 5, 1990, pp. 80–82.

*Primary Examiner*—Robert J. Warden
*Assistant Examiner*—L. M. Crawford
*Attorney, Agent, or Firm*—Philip J. Feig; Stephen C. Kaufman

[57] ABSTRACT

During wafer fabrication, a transportable enclosure, such as a Standard Manufacturing InterFace (SMIF) pod encloses a nascent product, such as a semiconductor wafer, to protect the wafer against contamination during manufacture, storage or transportation. However chemical vapors emitted inside the pod can accumulate in the air and degrade wafers during subsequent fabrication. In order to absorb the vapors inside a closed pod, a vapor removal element typically including an activated carbon absorber, covered by a particulate-filtering vapor-permeable barrier, and covered by a guard plate with holes is disposed within the enclosure. A vapor removal element is disposed closely adjacent to each respective wafer. Alternatively, a single vapor removal element is located inside the enclosure. In certain instances, a fan or thermo-buoyant circulation causes any vapors located inside the enclosure to a vapor removal element for removal. Alternatively, a porous vapor removal element may be disposed for removing vapors from air entering the enclosure. In another embodiment a vapor removal element is integrated with the back face of each wafer.

24 Claims, 15 Drawing Sheets

VAPOR DRAIN SYSTEM

BACKGROUND OF THE INVENTION

The present invention relates to transportable enclosures for reducing particle contamination during manufacture, storage or transportation of components and more particularly to standardized mechanical interface (SMIF) systems employing a vapor drain system for removing chemical vapors and components from within the enclosure.

Chemical vapor contaminants are known to alter the processes used to manufacture sensitive devices such as microcircuitry. Such chemical vapor contaminants have historically been inadequately addressed. These vapor contaminants originate from a variety of sources, including the enclosures used to protect components from particulate contamination. Outgassing of plastics, adhesives and sealant materials can make the enclosure itself a source of chemical contaminants. In addition, externally produced vapors are capable of contaminating an open enclosure. Later, when the enclosure contains a sensitive component, such as a semiconductor wafer, these vapors can be re-emitted and contaminate the wafer.

The import of particulate contamination on the manufacture of components having very tight tolerances, such as disk files and microcircuitry, is well known. Processes are carefully controlled to reduce by many orders of magnitude the quantity of particles in the manufacturing environment as evidenced by the increased use of "clean rooms" and by improvements in particle detection and removal technology.

Chemical contamination is beginning to be recognized as a major factor in manufacturing operations. Such contamination was first recognized in process chemicals, such as impurities in gases used in semiconductor device manufacture and in solvent residues.

Process contamination caused by environmental airborne vapors is also a growing problem. Such vapors are everywhere in the environment at low concentrations. The origin of the vapor is diverse and includes plasticizer vapors, process materials from elsewhere in a factory, chemicals used in cleaning and air conditioning systems, cosmetics, adhesives and chemicals used in neighboring factories and in agriculture. These contaminants can degrade manufacturing by affecting the sensitivity of lithographic, etch and other processes, interfering with adhesion between surfaces, altering the wetability of surfaces, reducing effectiveness of cleaning processes, interfering with chemical reactions and inducing corrosion of metallurgy.

Some chemical compounds are capable of travelling as vapors which deposit a mono-molecular layer on the wafer, which degrades subsequent wafer manufacturing processes and product quality. An important class of organic compounds has a molecular mass between approximately 150 and 600 AMU (atomic mass units) and non-specific chemical reactivity. These compounds emit significant vapors add adhere as a mono-molecular layer to cause product degradation. One such compound is di-alkyl-phthalates, which is a widely used plasticizer. In contrast, organic compounds having much larger molecular masses typically do not emit significant vapor and organic compounds having much smaller molecular mass typically do not adhere sufficiently to a surface, and hence both types of components usually do not pose a problem.

Another class of relatively light compounds has specific chemical reactivity. For example, many metals are attacked by halogenated solvents (e.g., di-chloromethane or tri-chloro-ethane) and by organic acids (e.g., acrylic or benzoic acids).

Vapor self-contamination is particularly relevant. Even a sealed enclosure traps and accumulates vapors. The vapors are emitted by enclosure materials (such as plastics, adhesives, sealants and their trace components), external vapors absorbed onto the enclosure surfaces and into seals when the enclosure is open, and vapors emitted by nascent products.

Process chemicals and enclosure materials should be chemically selected to minimize these problems. In view of practical restraints, it is very difficult to eliminate contamination from trace vapors and monomolecular layers solely by material selection. Moreover, vapor emission is only one of the criteria which must be met by nascent process materials such as resists.

In the complex processes involved in the fabrication of microcircuitry, there is a recent trend toward containing the components in sealed enclosures which are generally kept closed, and are opened only briefly and intermittently during fabrication. This manufacturing method has been developed for maintaining a particulate free environment. Unfortunately, these enclosures have the unintended result of concentrating vapor contamination. This effect has been inadequately understood in the prior art.

Such sealed enclosures are sometimes referred to as standardized mechanical interface (SMIF) systems. SMIF systems are described in U.S. Pat. No. 4,739,882 assigned to Asyst Technologies Inc. and in U.S. Pat. No. 4,532,970 and U.S. Pat. No. 4,534,389 both assigned to Hewlett-Packard Company, which patents are each incorporated herein by reference.

The present invention overcomes the difficulties encountered by heretofore known enclosures by equipping each enclosure or SMIF system with a device which acts to remove vapors and shall be referred to hereinafter as a vapor removal element. While the invention is primarily intended for use in connection with a SMIF system, the invention is equally applicable for use with any sealed enclosure used for manufacturing, storing or transporting of components sensitive to chemical vapors.

In addition to semiconductor, mechanical, electrical and electronic products and processes, the present invention has application to any product with potential or known sensitivity to vapor borne contamination, such as pharmaceuticals, clinical diagnostic and therapeutic products, chemicals and genetically engineered products.

SUMMARY OF THE INVENTION

If an enclosure lacks a vapor drain system, but contains a source which steadily emits vapors, then the vapor will accumulate in the air, eventually leading to high vapor concentration, probable deposition on enclosed wafers, and possible degradation of subsequent wafer processes.

In contrast, the present invention teaches the use of a vapor drain system to counteract vapor contamination, particularly from sources which emit vapors inside the enclosure. Thus vapor emission by the source is counterbalanced by vapor removal by the vapor drain system. By using the proper vapor drain system embodiment, a steady state condition will result with a small or otherwise acceptable vapor concentration in the environment within the enclosure.

In order to achieve a relatively small vapor concentration on the wafers, a large vapor conductance from the wafer to the vapor drain system is required as well as a large vapor conductance within the vapor drain system. In several embodiments, the former is provided preferably by vapor diffusion between a wafer and a closely spaced vapor drain or by air movement and vapor convection between a wafer and more distantly disposed vapor drain.

A vapor drain system typically comprises two structures: a global/aero structure and a vapor removal element which brings together vapors and the vapor removal element. The internal structure of the vapor removal element removes vapor from the surrounding environment.

A typical vapor removal element or internal structure includes an absorber layer for absorbing vapors (e.g. activated carbon cloth), a barrier layer for separating the absorber from a particulate-sensitive region (e.g. HEPA (high efficiency particular air) filter or permeable organic membrane) and a guard plate, usually with channels to guide air and stiffness for mechanical support and protection. Typically these structures are thin and are congruent with a wafer.

Other embodiments include an internal structure comprising a vapor-absorbing coating on a substrate. The coating is preferably titanium, deposited carbon or oxidized/activated resist or other organic polymer.

Selection of a preferred embodiment for the global/aero structure depends upon the enclosure structure, the vapor sources (including intensity and location), the vapor chemistry and wafer surface. The selection is also dependent upon the enclosure usage, i.e. cost and machine, procedure, policy for loading/unloading wafers in the enclosure and enclosure cleaning.

An especially simple global/aero embodiment protects a single wafer enclosure by locating the vapor-sensitive surface of the wafer closely adjacent to a thin vapor removal element in the base of the enclosure.

In a more typical multi-wafer enclosure for containing a stack of parallel wafers, several alternative embodiments are preferred. A global vapor drain system comprises a large thin vapor removal element inside the enclosure cover. This embodiment is simple to implement, compatible with existing equipment and processing procedures and can counteract moderate vapor sources. Alternatively, a closely adjacent vapor drain system arrangement is used where each wafer is disposed closely adjacent to an individual vapor removal element. When loading/unloading the enclosure, each wafer and its associated vapor removal element are handled as a single unit. This embodiment counteracts very intense vapor sources, but complicates load/unload procedures. In an inter-leaved vapor drain system embodiment, vapor removal elements and wafers are alternated throughout the stack. This embodiment counteracts intermediate vapor sources, complicates load/unload procedures and reduces enclosure capacity by 50 percent. In a variation, a flip-leaved vapor drain system arrangement is employed where a two-sided vapor removal element is disposed between pairs of wafers in a stack. This embodiment provides intermediate vapor removal, complicates load/unload procedures, but reduces enclosure capacity by only one-third.

In a further modification, an integrated sheet vapor drain system arrangement is employed when the back of each wafer is coated with an absorbing layer for removing vapors from the surface of the adjoining wafer. This embodiment maximizes enclosure capacity, facilitates existing load/unload procedures but require the addition of a special coating on each wafer.

In further preferred embodiments such as a thermobuoyant vapor drain system, a vapor removal element is located inside the cover of the enclosure. The air within the enclosure is heated near the bottom and cooled near the top of the enclosure. The non-uniform temperature difference in the air produces a non-uniform air density, buoyant forces and air circulation. The result is that vapors are carried close to the vapor removal element for improved vapor removal. This embodiment can counteract even strong vapor sources with undiminished wafer capacity per enclosure, but requires a more complex enclosure design. In a flow past vapor removal element arrangement, a vapor removal element is located in the cover, usually on a sidewall. Inside of the enclosure are a fan and an optional particulate filter. The fan forces air circulation which covects any vapor past the vapor removal element for improved vapor removal. This design counteracts intense contamination, facilitates conventional load/unload procedures and maximizes enclosure capacity but adds appreciably to the complexity of the enclosure. In a modified embodiment, an air blower and air duct are provided. A porous vapor removal element and particulate filter are disposed across the duct opening for trapping vapors which the fan forces into the duct. This embodiment provides aggressive vapor removal and permits existing load/unload procedures with maximum enclosure capacity at the cost of significantly increased enclosure complexity.

In alternative embodiments a breather vapor drain system is located across an aperture in the cover of the enclosure. During barometric and thermal cycles, the enclosure breathes through the vapor removal element and exchanges inside and outside air. The breather vapor drain prevents external vapors from entering the enclosure and also counteracts moderate internal vapor sources. In a purge vapor drain system embodiment, porous vapor removal element are located across both of two apertures on opposite sidewalls of the enclosure cover. Air is forced into the enclosure through one vapor removal element and removed from the enclosure through the other vapor removal element. This embodiment counteracts external vapors, moderate internal vapor sources but requires external air connections . Another embodiment is a sampler vapor drain system where the vapor removal element collects a sample of the vapor for analysis. This is facilitated by a vapor removal element which reversibly absorbs vapors. Yet another embodiment is a reservoir vapor drain system, which includes a reservoir containing a chemical which emits a desirable vapor such as an anti-corrosion agent or an anti-electro-static agent.

In general, in order for any of the above embodiments to gain wide acceptance, the resulting enclosure must be compatible with existing enclosures in terms of function, related tools and techniques. Thus, the vapor drain system should be particulate-free, compatible with a sealed enclosure which blocks particulate, compatible with loading and unloading wafers in the enclosure, comparable with wafer processing and enclosure cleaning methods. Also the various embodiments of this invention provide compatibility with various classes of enclosures: enclosures for a single wafer or multiple wafers, an enclosure for use with stagnant air or moving air, an enclosure which permits or does not permit a vapor removal element to be mounted like a wafer, and particularly compatible with various SMIF enclosures.

The above embodiments will be explained in detail hereinbelow.

The vapor removal element may be in the form of a chemical absorber, e.g. activated carbon placed inside a micro-porous membrane to prevent dust emissions. The absorber causes vapor removal from the environment which counter-balances vapor emission. Proper vapor engineering results in a steady state condition and very low vapor concentration.

As used herein, the term "absorber" will be understood to include vapor removal by adsorption, absorption, physisorption, chemisorption, bulk chemical reaction, and even permeation through a membrane to a sink for vapor. The term "air" will be understood to include not only normal air, but any other gas, such as dry nitrogen.

The term "wafer" will be understood to include not only semiconductor wafers but also dense printed circuits, display panels, disks or plates for information storage (including storage by magnetic, optical, magneto-optical, and scanning tunneling microscope processes) or other components. In addition, the term "wafer" will be understood to include various biological, pharmaceutical and bio-engineered products. The term "nascent wafer" will be understood to mean a wafer in the course of fabrication, particularly when it is vulnerable to chemical vapor. The term "enclosure" will be understood to include not only SMIF pods or SMIF enclosures, and wafer boxes, but also so-called "orange boxes" for multiple wafers, and "single wafer boxes" and various cassettes. More generally "enclosure" will be understood to include any substantially closed structure to separate nascent wafers from the external environment during fabrication, manufacturing, processing, storage, transfer, or shipment.

The prior art inadequately considered chemical vapor contamination inside an enclosure, especially inside a closed enclosure. Recent experiments leading to the instant invention have demonstrated that several sources, often those located inside an enclosure, can emit vapors and thus degrade nascent wafers.

One contamination source is the enclosure material itself. For example, gaskets often use silicon rubber which can emit silicone oil and degrade adhesion during subsequent wafer fabrication. Also other enclosure materials (such as plastics, adhesives, sealants and their trace components) often emit vapors.

Another source of contamination is indirect contamination of the enclosure. When an enclosure is open, external vapors can contaminate the enclosure surfaces and seals. Later, when the enclosure contains nascent wafers, these vapors can be re-emitted and contaminate enclosed wafers.

The nascent wafer itself is another source of contamination which carries and emits process chemicals. These chemicals can contaminate enclosure surfaces. Later these surfaces can emit the chemicals as vapors and contaminate the wafers at later processing stages, where the same chemicals then cause damage.

"Self contamination" or residues from previous processes which remain on the wafers is yet another source of contamination. These residues emit a vapor that degrades subsequent wafer processing.

When wafers are stored in a well-ventilated open clean-room, these vapor sources are not problems. When the same wafers are contained in an enclosure without a vapor drain system, the vapor is deposited as a very thin layer which degrades later processes on certain areas on the wafer. More specifically, nascent wafers with patterned resist emit organic vapors. These vapors degrade areas where resist was previously removed, and thus degrade the finished wafer.

By using an enclosure including a suitable vapor drain system the chemical vapor contamination can be prevented, even in a closed enclosure. However, it may be more reliable to prevent particulate contamination in a closed enclosure than to prevent it in a well-ventilated open clean room. Moreover, an enclosure allows production of high density wafers in an existing clean room, without very expensive clean room upgrades.

In accordance with the teachings of the present invention, a vapor drain system removes vapors emitted inside of the enclosure, and/or prevents entry of vapors from outside the enclosure. The vapor conductance or normalized vapor removal rate from a wafer to a vapor drain is determined by the geometry and aerodynamics of the enclosure and the vapor drain system using vapor diffusion, vapor buoyant convection, or vapor forced convection.

A principal object of the present invention is therefore, the provision of an enclosure including a vapor drain system for minimizing chemical vapor contamination of a component in the enclosure.

Another object of the invention is the provision of an enclosure including a vapor drain system for removing vapors from within the enclosure.

A further object of the invention is the provision of an enclosure including a vapor drain system for lowering the vapor concentration within the enclosure from vapor sources located within the enclosure.

A still further object of the invention is the provision of an enclosure including a vapor drain system which is compatible with existing enclosures and related tools and processing methods.

Further and still other objects of the present invention will become more clearly apparent when the following description is read in conjunction with the accompanying drawings.

DETAILED DESCRIPTION

Figure 1:
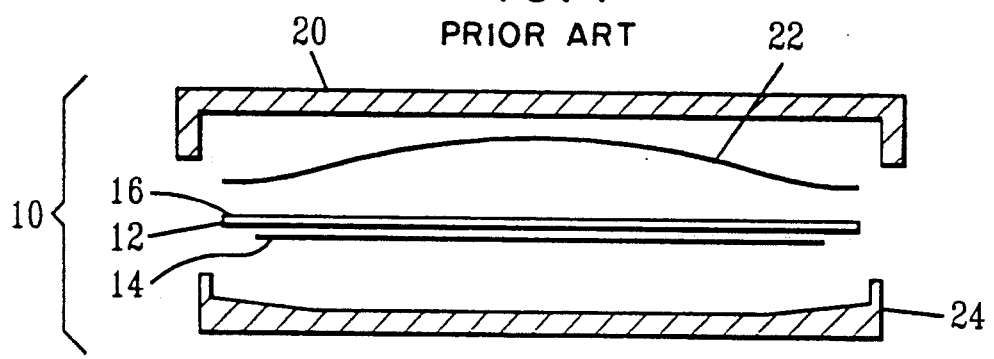
FIG. 1 is a side cross-sectional view of a prior art enclosure for holding a single wafer.

Since this invention is typically used with a SMIF pod, it is necessary to review its structure. Referring to the figures, and to FIG. 1 in particular, Fluroware Inc. makes an enclosure to hold a single wafer, as shown in FIG. 1. For the purposes of the present invention, this enclosure will be considered an especially simple enclosure for a nascent wafer. The enclosure 10 is a flat cylindrical box, slightly larger than a wafer 12. The enclosure includes a shallow base 24, a cover 20, a sealing mechanism (not shown), and a soft spring 22. The spring 22 gently presses from the cover 20, to the perimeter region 16 of the wafer 12 adjacent to the concave base 24. The spring maintains the position of wafer 12, and prevents contact with the sensitive face 14. The base 24, cover 20, and spring 22 are made of particulate-free material, typically high density polyethylene.

Figure 2:
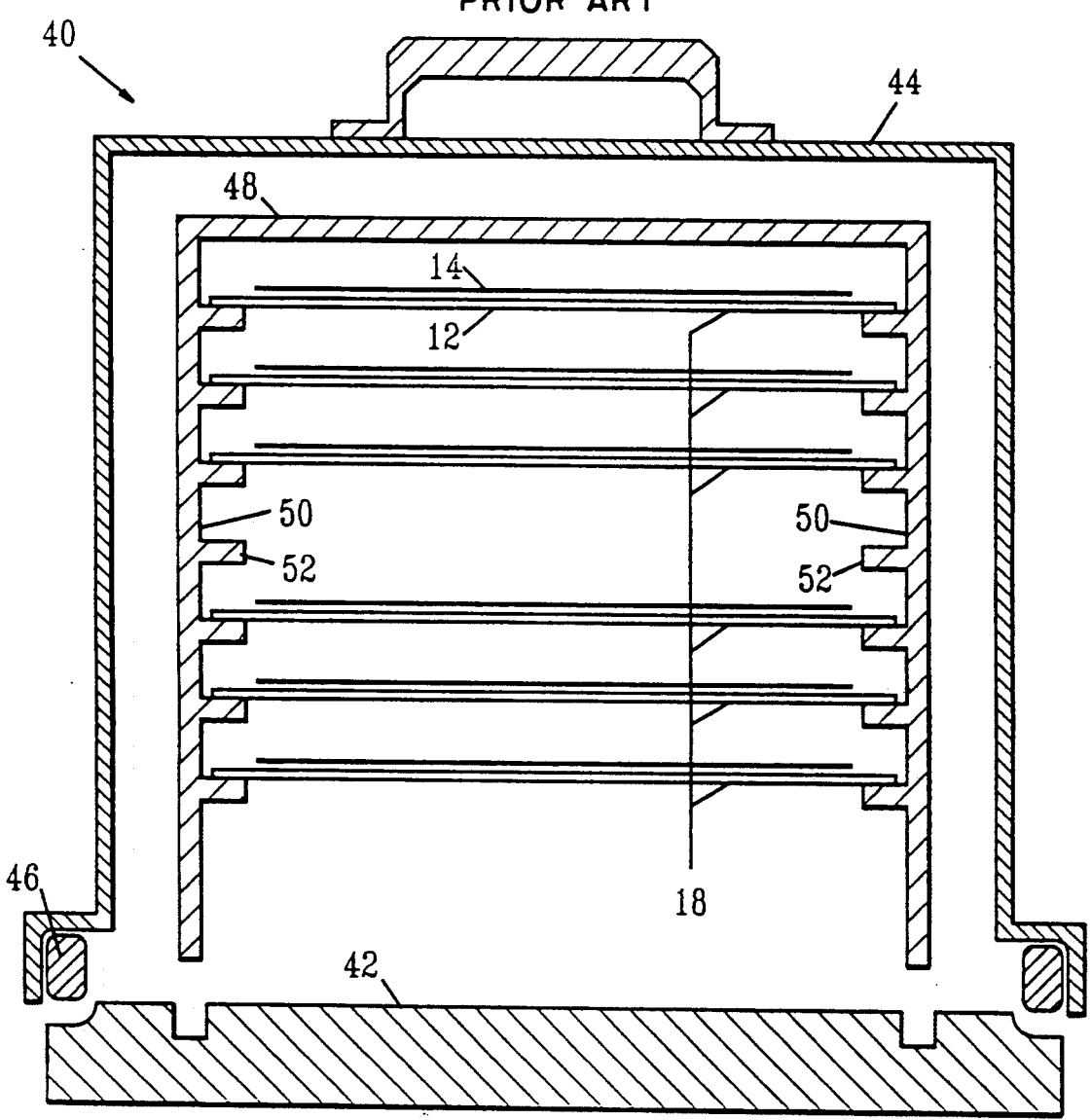
FIG. 2 is a side cross-sectional view of a typical SMIF pod.

FIG. 2 shows a more typical enclosure 40 which is designed to hold many wafers 12 during fabrication. Such a design is described in U.S. Pat. No. 4,739,882, and is of the type manufactured by Asyst Inc. The enclosure includes a rigid base 42, a box-like cover 44, and a gasket 46 to exclude external air and particulates. Inside the enclosure there is a frame 48, with brackets 52. Each wafer 12 spans a pair of brackets 52 at a respective site 50 in a stack 18 of wafers 12. Each wafer 12 has a sensitive face 14. A representative SMIF pod can enclose 25 wafers, each 200 mm diameter, and has external dimensions approximately 40 cm wide, 40 cm deep, and 50 cm tall. The stack 18 of wafers 12 has a pitch of approximately 8 mm.

Figure 3:
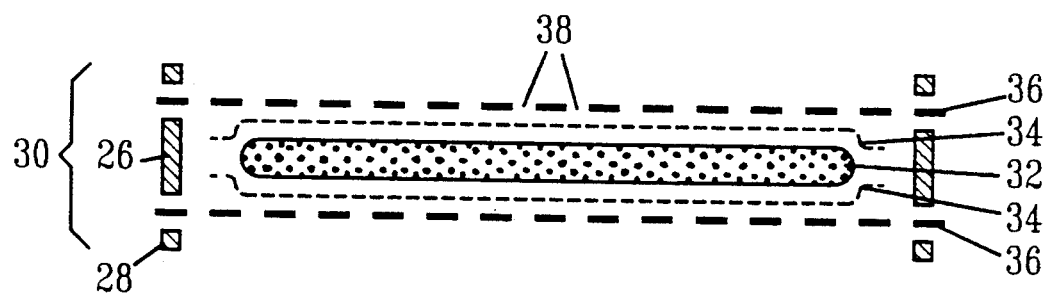
FIG. 3 is an enlarged, side cross-sectional view of a vapor removal element.

In accordance with the teachings of the present invention a preferred vapor drain system includes a vapor removal element and a global/aero structure. FIG. 3 shows the vapor removal element of a preferred embodiment of a vapor removal element 30. For graphical clarity, shown is a blown-up cross section with considerable exaggeration of vertical thicknesses and clearances.

The vapor removal element 30 comprises several stacked layers of vapor removal elements. At the center of the vapor removal element 30 is an absorber layer 32. A preferred absorber material is activated carbon fabric, such as Kynol ACC material produced by Nippon-Kynol Inc. Surrounding absorber layer 32 is a barrier layer 34 which is permeable to vapor, but blocks particulates. A preferred barrier layer is a micro-porous membrane of expanded permeable PTFE (Poly-Tetra-Fluro-Ethylene). An alternative preferred barrier layer is a laminated micro-fiber filter, such as used in a typical HEPA filter material. Yet another alternative barrier layer is an electro-statically charged web, such as Elec-Treet by Donaldson Inc. The barrier layer typically has a polyester scrim bonded with fusable polyethene web. The bottom and top parts of the barrier layer 34 completely enclose the absorber layer 32. Above and below the barrier layer 34 are optional guard plates 36, each relatively rigid, and each with channels 38 for allowing the passage of air. On each side of the vapor removal element is an internal spacer 26 or housing, and an optional external spacer 28. In some cases, these spacers may be joined with each other or with adjacent hardware.

Any vapor located near the vapor removal element 30 will rapidly travel a small distance by diffusion, percolation or airflow, through channels 38 in guard plate 36, through a barrier layer 34, into the absorber layer 32 where the vapor is removed from the air.

The rigid guard plates 36 mechanically protect the absorber 32. Also spacers 26 and 28 minimize mechanical forces on the guard plates 36, barrier layers 34, and absorber layer 32. The guard plate minimize crumbling and particulate formation in the absorber layer 32. Furthermore, any particulate formed in the absorber layer 32 will be trapped inside the barrier layer 34. Thus the absorber layer 32 in the vapor removal element system 30 will not emit dust.

The preferred material for the absorber layer 32 depends on the vapor chemistry. Activated carbon fabric is preferred for organic vapors with medium molecular weight, such as di-octyl-phthalyate or silicone oil. For corrosive vapors, a better absorber material is activated carbon treated with a base. An example is neutralization and removal of benzoic acid vapor by sodium carbonate base. Another preferred material is described in U.S. Pat. No. 5,124,856, entitled "Unitary Filter Media" and assigned to the same assignee as the present invention. Other absorber layers can include nano-porous materials such as zeolites and aero-gels. In an alternative absorber embodiment a stiff plate with holes includes a suitable resin coating, such as Novolac. The coating is polymerized to plastic and then converted in situ to activated carbon.

The vapor removal element shown in FIG. 3 is used with various global/aero embodiments as described below. In some embodiments, vapor is absorbed from both the top and bottom surfaces of the vapor removal element cover. In other embodiments, only one side of the cover is used to absorb vapors and the other side of the vapor removal element cover may be simplified, eliminated or unified. In still other embodiments, there is a distinct air flow penetrating the vapor drain, entering at one side, and exiting at the other side.

Several design features are particularly relevant in designs having a large distinct air flow. The air channels 38 in guard plates 36 are designed to spread air approximately uniformly across the barrier layer 34 and absorber layer 32. This uniformity minimizes local saturation and local failure. In some applications, the absorber layer 32 and barrier layer 34 are pleated. Pleating increases the flow area, which allows more air flow with less pressure, within a moderate volume for the vapor drain. Also, pleating increases the vapor capacity (the maximum mass of vapor which the absorber layer can hold) within a moderate volume.

Figure 4:
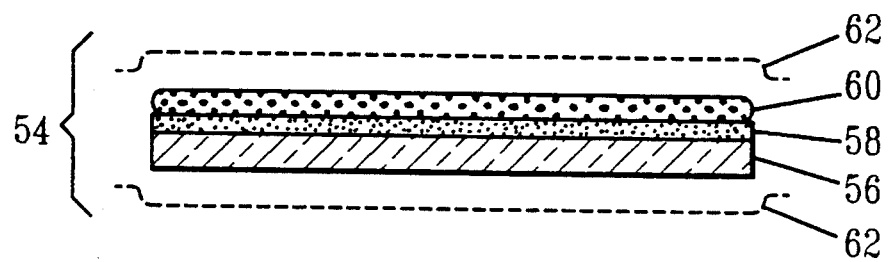
FIG. 4 is an enlarged, side cross-sectional view of a sheet vapor removal element.

FIG. 4 shows another preferred embodiment for the internal structure, referred to as a sheet vapor removal element 54. The sheet vapor removal element 54 comprises several layers: substrate layer 56, an optional joining layer 58, absorber layer 60, which is preferably applied as a coating, and an optional barrier layer 62 to block dust.

These layers may be distinct or alternatively, may be a unified construction. A preferred embodiment of the sheet vapor removal element includes a thin sheet of titanium which implicitly unifies several layers. However, it may be necessary to re-activate the surface, by cleaning with ultra-violet light and/or microwave radiation and/or by exposure to ozone, or by sputtering more titanium. The absorber layer 60 is a coating such as sputtered titanium.

Some deposited or sputtered coatings can be quite dust-free and tough in which case, the barrier layer 62 is not needed.

An alternative absorber layer 60 is a coating of activated carbon. In other applications, it is possible to start by applying resist or other organic coating upon the substrate 56 and then oxidize and/or activate the resist or coating in place.

In this partly unified versions, there is self-adhesion between the coating/absorber 60 and the substrate 56 so the joining layer 58 need not be a distinct layer of material.

In another preferred embodiment a substrate 56 is coated with an organic film and an adhesive layer 58. Then the organic film is oxidized and/or activated in place, to form an absorber layer 60 of activated carbon.

The substrate 56 can be a sheet of stainless steel, glass, silicon or the like.

The substrate 56 can be unified with various convenient structures, such as the inside of the cover 44 in FIG. 2. When a sheet vapor removal element 54 is formed by a coating applied inside the cover 44, the cover can be recoated as frequently as required.

In an alternative embodiment of the sheet vapor removal element, the vapor removal element has physically independent layers. For example, the substrate 56 is a sheet of silicon, the adhesive layer 58 is a discrete film layer, the absorber layer 60 is a sheet of thin solid activated carbon, and the barrier layer 62 is a nano-porous membrane.

Figure 5:
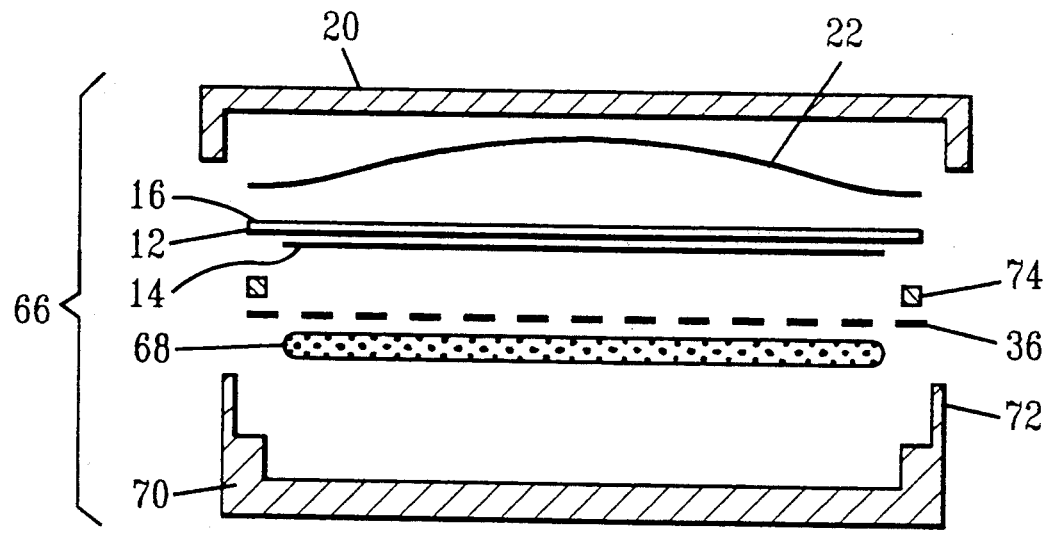
FIG. 5 is a side cross-sectional view of an enclosure for holding a single wafer including a vapor removal element in accordance with the teachings of the present invention.

FIG. 5 shows the relationship between the vapor removal element and wafer in accordance with the teachings of the present invention. A single wafer 12 having a sensitive face 14 is contained within an enclosure 66. A thin planar vapor removal element 68 such as that described above in conjunction with FIG. 3, is disposed opposite the sensitive face 14 of wafer 12. The vapor removal element 68 covers most of the area inside the base 70. The base 70 is dimensioned to accommodate both the vapor removal element 68 and the wafer 12. A spring 22, spacers 72, 74 and a guard plate 36 hold the wafer 12 in place. When the shallow enclosure 66 contains a wafer 12, the vapor removal element 68 is disposed closely adjacent to the sensitive face 14 of the wafer 12. Therefore, any vapor near the sensitive face 14 will rapidly diffuse into the vapor removal element 68.

When the enclosure 66 is opened for cleaning, the guard plate is lifted, so the vapor removal element 68 can be removed and replaced. Alternatively, the enclosure 66 and vapor removal element 58 may be considered and treated as a single disposable unit.

In the present invention, chemical vapors can be parameterized like "absolute humidity" and "relative humidity" in meteorology. It is possible to measure chemical vapor in air by its "vapor concentration". Vapor concentration is the mass of chemical vapor (excluding the mass of air) per unit volume of air. For a particular chemical vapor and particular temperature, the air can contain a certain maximum absolute vapor concentration, which is called the "saturation vapor concentration". For many vapors, this saturation vapor concentration increases rapidly and approximately exponentially with increasing temperature.

For vapor in an air at a well-defined temperature, the "Relative Vapor Concentration" (RVC) is defined as the absolute vapor concentration divided by the saturation vapor concentration at that temperature. Thus the RVC varies from 0% to 100%. For vapor and wafers without specific chemical interaction, at RVC less than 10%, typically there will be little vapor deposition on a wafer. Typically, at about 25% RVC, an approximate mono-molecular layer will form on a wafer. As relative vapor concentration increases towards 100%, then multi-molecular layers will be deposited.

In order to understand the interaction between the vapor present in the enclosure and the vapor removal element, consider an enclosure with vapor transfer, including a vapor source, vapor travel across the enclosure, a wafer, and a vapor removal element. Also, assume there is a steady state of vapor. Assume further that there is a tool to measure local vapor concentration. Select several locations inside the enclosure at which to measure vapor concentration, including a location near the vapor source, a location near the wafer, and a location near the vapor removal element. In some cases, the air is well mixed, and the measurement is not sensitive to the location. In other cases, along a surface ( such as a vapor source, wafer or vapor removal element), there is a thin vapor boundary layer. In such cases, a location just outside the boundary layer is chosen. In still other cases, there is a thick vapor gradient, in which case, a location which allows extrapolation to the surface is chosen. In the following description, let "nearby air" indicate "at the corresponding location".

With the above arrangement, "vapor conductance" may be defined rather generally. Consider two vapor regions at two locations. Define the "vapor conductance" between the two regions as the net amount of vapor transferred per unit time, divided by the difference in absolute vapor concentration. Thus one could measure vapor conductance to travel from the vapor source to the vapor removal element.

For a vapor removal element which removes vapor from nearby air, measure the amount of vapor removed per unit time, and measure the absolute vapor concentration in nearby air. The ratio is defined to be the "vapor drain conductance".

If there are multiple vapor removal elements, then the "total vapor drain conductance" is the total amount of vapor removed per unit time divided by the absolute vapor concentration. In many cases, the total vapor drain conductance is the sum of the vapor conductance for each individual vapor removal element.

For a source which emits vapor into nearby air, define its "vapor source conductance" in a corresponding manner. Measure the absolute vapor concentration and temperature of nearby air, and measure the amount of vapor emitted per unit time. Define the "vapor source conductance" as the amount of vapor emitted per unit time divided by the saturation concentration at the same temperature minus the absolute vapor concentration of nearby air. If there are multiple vapor sources, then the "total vapor source conductance" is the measured of total vapor amount emitted per unit time divided by saturation vapor concentration minus absolute vapor concentration.

Thus vapor conductance has the units of volume/time, and can be understood as the volume rate of vapor travel, emission or removal. These definitions measure the effect of vapor diffusion, vapor convection, and aerodynamics.

Vapor conductance is generally independent of the vapor concentration inside the enclosure. In most cases, a change in the vapor concentration will be cancelled by a proportional change in the vapor flow. In particular, vapor conductance is not effected by a slow uniform temperature change which causes large variations in saturation vapor concentration.

An enclosure with a vapor source and a vapor drain system can be analyzed by vapor transport theory. Suppose a steady state condition occurs. The relative vapor concentration (RVC) at a wafer will depend upon:

G.Source = Vapor conductance of the source.
G.Travel = Vapor conductance from source to vapor removal element.
G.Drain = Vapor conductance of the vapor removal element. and upon:
a fraction W, between 1 and 0, which indicates the location of the wafer between the vapor source and the vapor removal element.

These can be described by a simple algebraic formula, analogous to an electronic voltage divider with three series resistors. Let the "harmonic sum" of two real numbers A and B, be defined as:

$$A \& B = \frac{1}{[(1/A) + (1/B)]}$$

This leads to an important design rule for this invention: to reliably prevent wafer contamination, the "harmonic sum" of the vapor conductance for vapor removal element and the vapor conductance for vapor travel should significantly exceed the vapor conductance of the vapor source. Here a ratio of 1:1 is poor, 10:1 is good, 100:1 is excellent.

The following provides the algebraic details, which allows a more precise statement:

$$RVC = \frac{\left[\frac{W}{G.Travel} + \frac{1}{G.Drain}\right]}{\left[\frac{1}{G.Source} + \frac{1}{G.Travel} + \frac{1}{G.Drain}\right]}$$

It is useful to define:

$$\frac{1}{G.TD} = \frac{1}{G.Drain} + \frac{1}{G.Travel}$$

In the most serious case, the source is located on the wafer, so W is 1, and the RVC equation reduces to $$RVC = \frac{\left[\frac{1}{G.TD}\right]}{\left[\frac{1}{G.Source} + \frac{1}{G.TD}\right]}$$

$$RVC = \frac{1}{\left[1 + \left[\frac{G.TD}{G.Source}\right]\right]}$$

Therefore RVC corresponds to G.TD/G.Source as follows

| RVC | G.TD/G.Source |
|---|---|
| 1% | 99. |
| 5% | 19. |
| 10% | 9. |
| 20% | 4. |
| 33% | 2. |
| 50% | 1. |
| 67% | 0.5 |

For many chemically lion-specific vapors and wafer surfaces, substantial surface coverage occurs at about RVC=10%, and a mono-layer coverage occurs at about RVC=25%. As the vapor concentration rises toward RVC=100%, the deposition increases considerably.

In some cases, the threshold for wafer degradation is the deposition of about a mono-molecular layer. To prevent such deposition, RVC=10% or less, which corresponds to G.TD /G.Source=9 or more.

Of course, the precise relative vapor concentration at which surface coverage occurs, mono-layer coverage occurs or substantial coverage occurs is dependent upon the particular chemicals and surfaces involved. Thus the preceding RVC thresholds are only representative and the correct RVC threshold depends on the specific chemicals and surfaces involved.

Further, some design "margin" is needed. Saturated vapor concentration varies exponentially with temperature, so a few degrees temperature difference may imply a decade variation in concentration. Also, other chemical systems (vapor plus surface) will have somewhat different numbers. Nevertheless, in accordance with the teachings of this invention, it will be apparent to one skilled in the art that there are several embodiments and designs for those chemical systems.

Figure 6A:
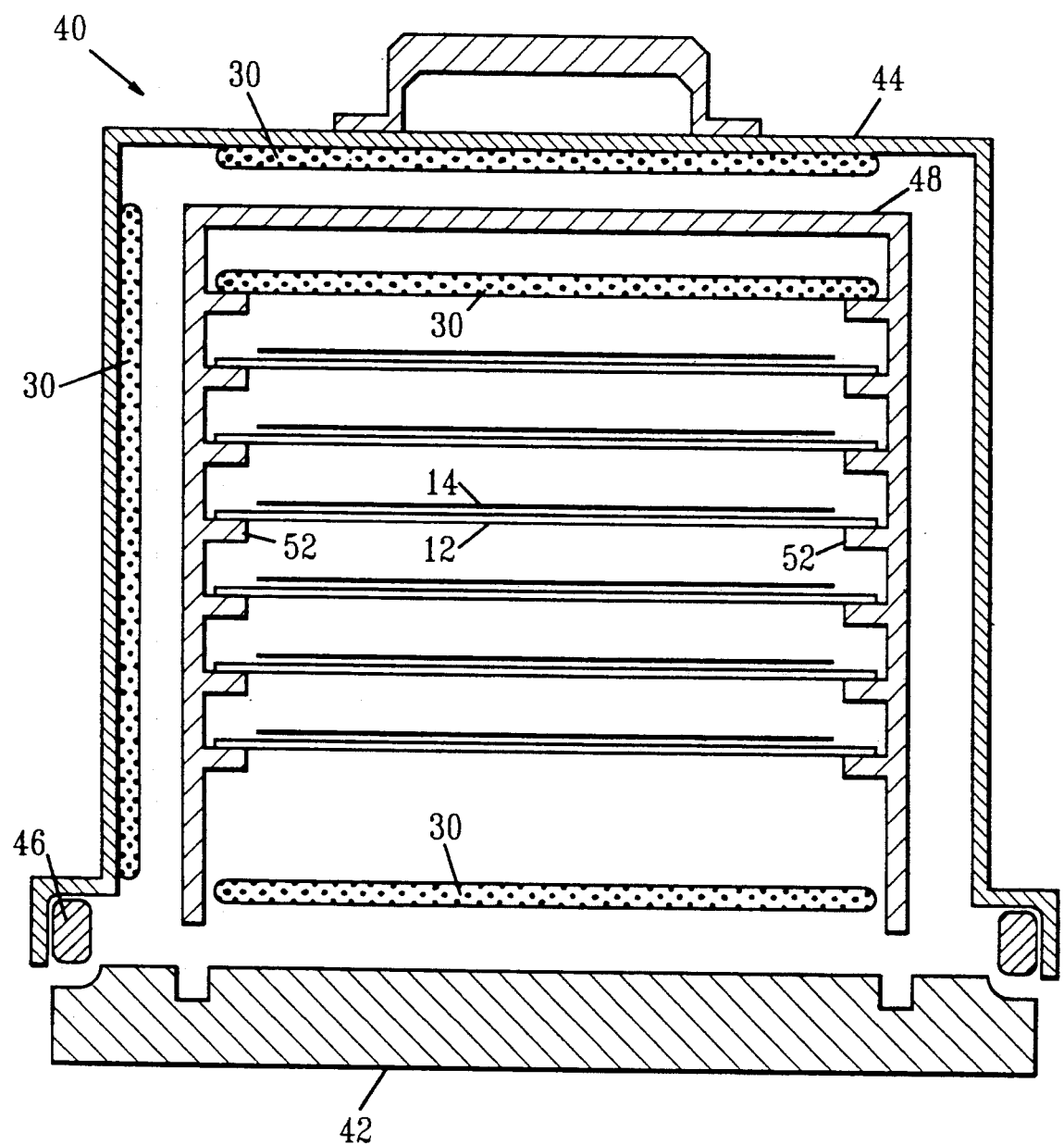
FIG. 6A is a side cross-sectional view of an enclosure containing vapor removal elements at several locations within the enclosure in accordance with the teachings of the present invention.

FIG. 6A shows an embodiment of the invention when one or more vapor removal elements 30 are disposed at different locations within an enclosure 40. The enclosure is preferably a SMIF pod as generally described above in conjunction with FIG. 2. The vapor removal elements may be located along a sidewall, or the top of cover 44 or along the base 42 of the enclosure 40. The term enclosure wall will be understood to include a sidewall, cover top or base. It is also possible to locate vapor removal elements at the uppermost brackets 52 within frame 48. Vapors are absorbed at each vapor removal element location, which vapors arise from within the enclosure or from the wafers 12 themselves.

Figure 6B:
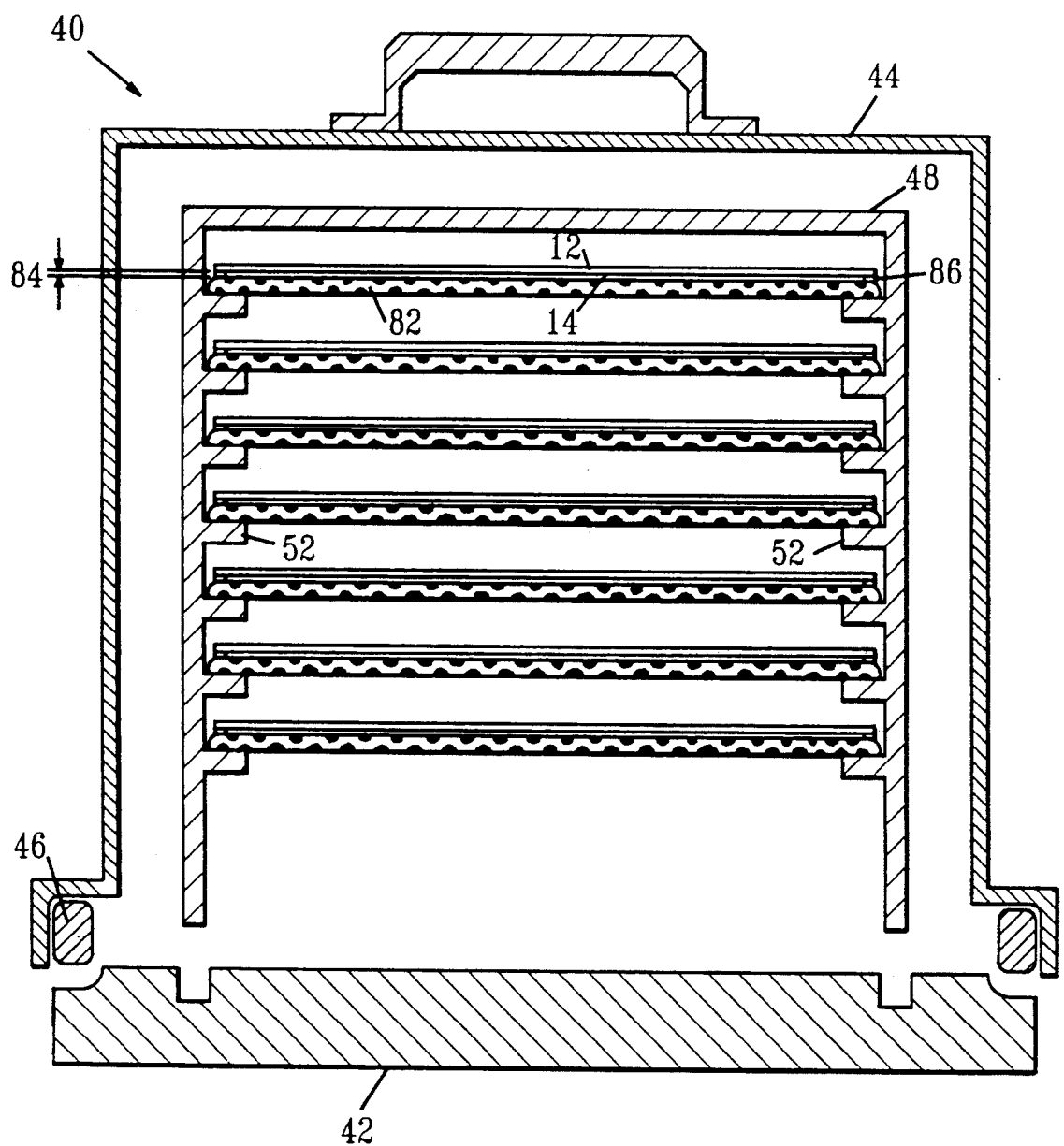
FIG. 6B is a side cross-sectional view of a closely adjacent vapor drain system embodiment of the present invention.

FIG. 6B shows a modification of the arrangement shown in FIG. 6A referred to as a closely adjacent vapor drain system embodiment of the present invention. Closely adjacent to each wafer 12, there is a vapor removal element 82, which is approximately congruent with the wafer 12. Between the wafer and the vapor removal element there is a thin gap 84, defined by a spacer 86.

In a typical SMIF pod 40, the stack of wafers and vapor removal elements have a narrow aspect ratio, typically an 8 mm pitch and a 200 mm diameter. Therefore, in the absence of air flow, a vapor molecule diffusing in the air space between two successive wafers will typically contact a wafer many times before it exits the space. Depending on the surface chemistry, the molecule may adhere to a wafer rather then diffusing out of the stack. This vapor adhesion can be prevented by use of a closely adjacent vapor removal element, as shown in FIG. 6B. For example, between a wafer 12 and its associated vapor removal element 82 there is a gap 84 on the order of 2 mm. Therefore the vapor removal element 82 will remove a vapor molecule as it diffuses sideways a root-mean-square distance on the order of 2 min.

Therefore, there is a very large vapor conductance from a wafer 12 to a closely adjacent vapor removal element 82. Even for severe contamination, such as a self-contaminating wafer, this embodiment will considerably reduce vapor contamination. For moderate contamination, such as silicone oil vapor emitted by a silicone rubber gasket 46, this embodiment will very greatly reduce vapor contamination.

The internal structure and function of the vapor removal element 82 are generally as described in conjunction with the vapor removal element shown in FIG. 3. Also, there may be a clip or other fastening means for attaching a wafer 12 to its associated vapor removal element 82. For loading/unloading, the wafer and associated vapor drain may be handled as single unit, or alternatively, they may be handled individually when not fastened to one another.

The closely adjacent vapor drain system arrangement shown in FIG. 6 provides very good vapor conductance between a wafer 12 and its associated vapor removal element 82. Moreover, this embodiment does not reduce the number of wafers which are contained in the enclosure. However, the arrangement has several limitations. For example, a non-standard machine and procedure is required to load/unload the wafers, particularly to assemble/separate a wafer 12 and its associated vapor removal element. In addition, this embodiment requires numerous thin vapor removal elements 82.

Figure 7:
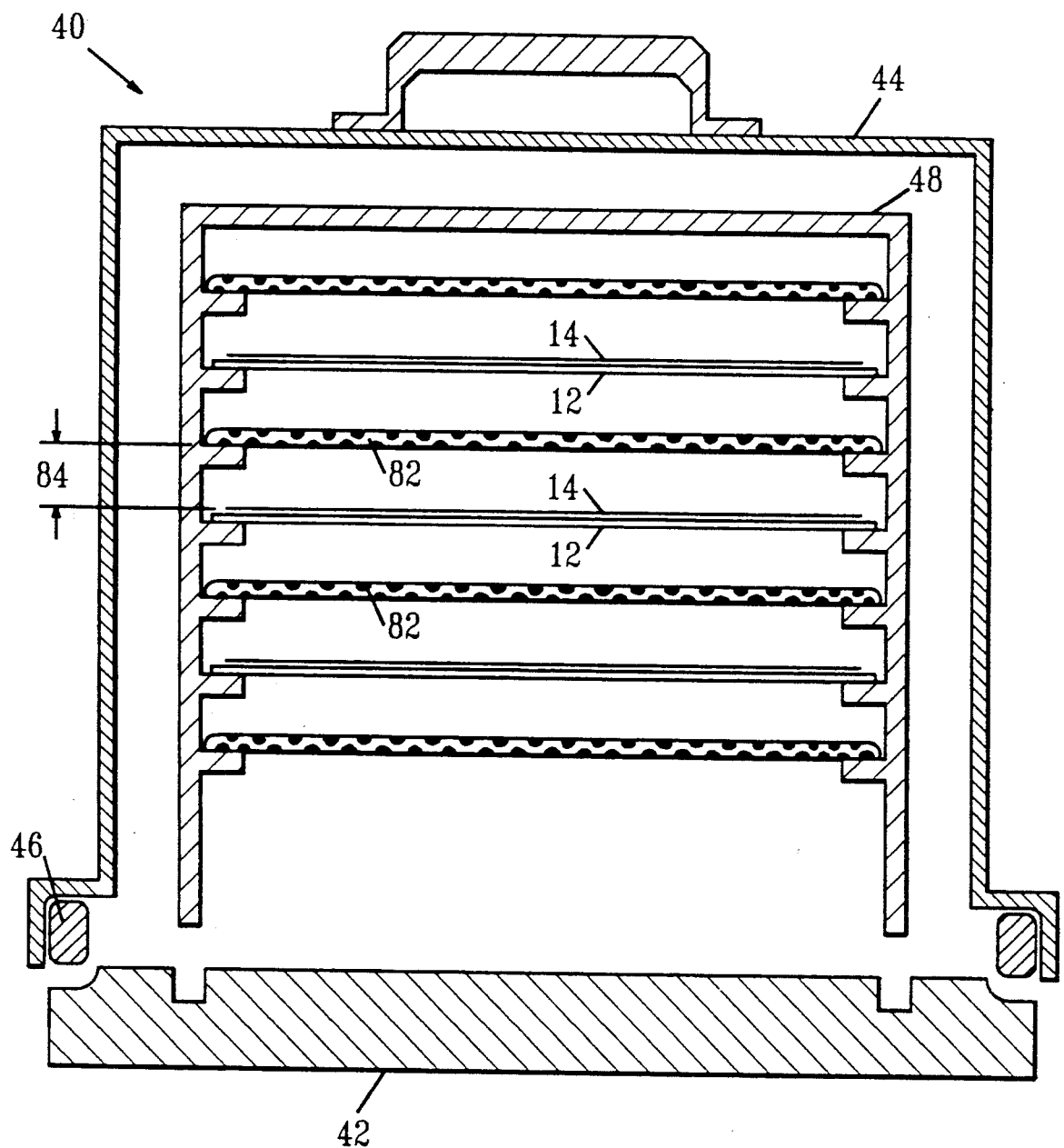
FIG. 7 is a side cross-sectional view of an inter-leaved vapor drain system embodiment of the present invention.

FIG. 7 shows a cross-section of of an alternative embodiment of the present invention which is an inter-leaved vapor drain system. The SMIF pod 40 and its parts are generally the same as those shown in FIG. 2. In addition, there are vapor removal elements 82 inter-leaved between wafers 12 in the stack. The gap 84 between each of the sensitive face 14 of wafer 12 and its nearest vapor removal element 82 is on the order of 6 mm, so a vapor molecule typically will be absorbed as it travels sideways a root-mean-square distance on the order of 6 mm. By using vapor removal elements 82 which are approximately congruent with the wafers 12, this embodiment is highly compatible with pre-existing pods, and pre-existing load/unload tools. However, this embodiment reduces the number of wafers contained in an enclosure by one-half.

The internal structure of a vapor removal element of the type shown in FIG. 3 is capable of absorbing vapors on both sides of the vapor removal element. This characteristic of the vapor removal element is used in the embodiment shown in FIG. 8 which shows the global-/aerodynamic structure for a flip-leaved vapor drain system embodiment of the present invention. A SMIF pod 40 is as described above in conjunction with FIG. 2. The basic unit is a "trio" comprising a first wafer 12' with sensitive face 14' at the bottom, a two-sided vapor removal element 82, a second wafer 12'' with sensitive face 14''. Although each vapor removal element 82 is located at brackets 88 at a site usually used for locating a wafer, the number of wafers per enclosure is reduced by only one-third. Since every wafer 12', 12'' is near a vapor removal element 82, the vapor conductance is quite large. A limitation of the flip-leaved vapor drain system is the requirement of a non-standard machine and procedure to load/unload wafers.

Figure 8:
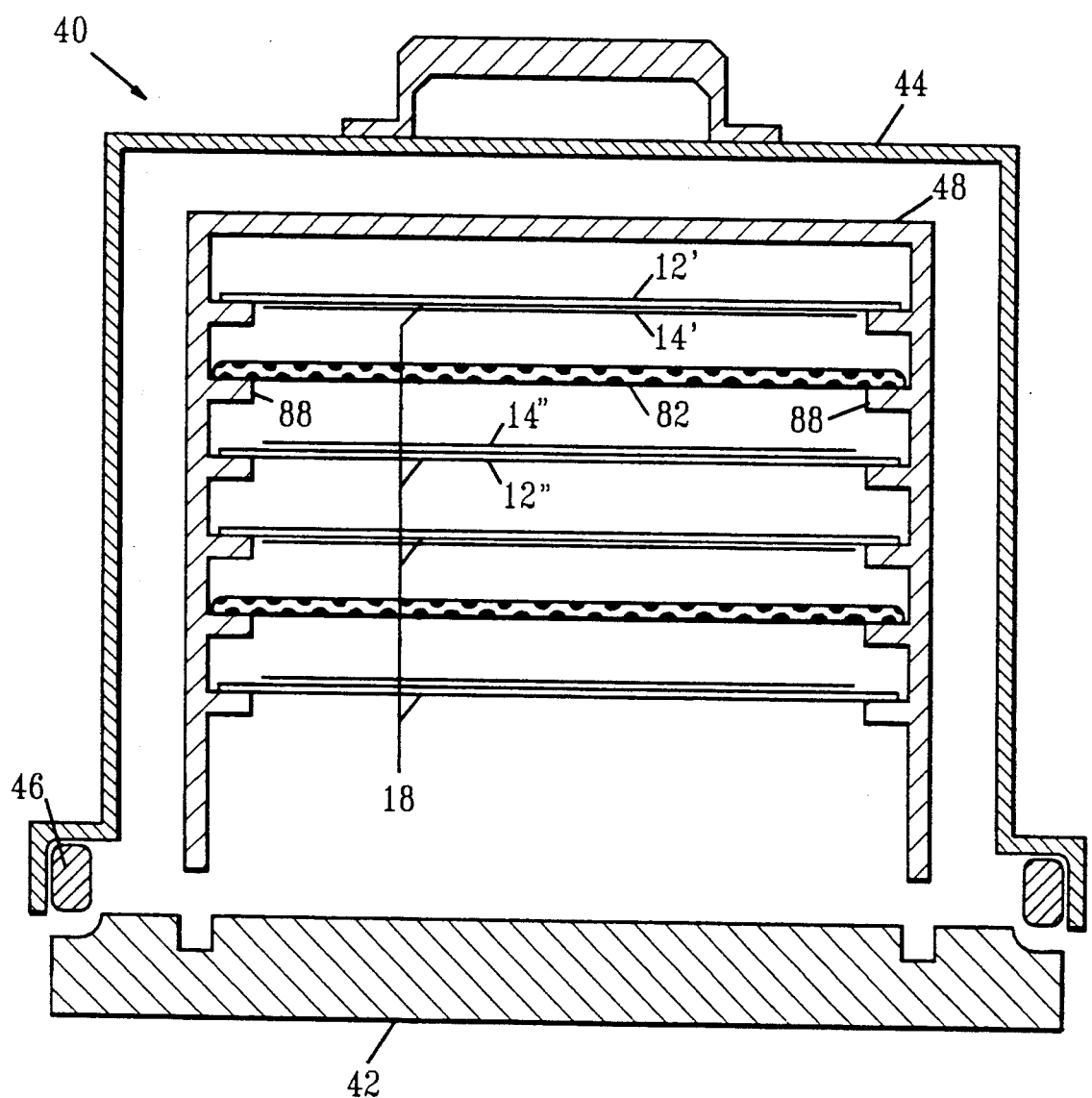
FIG. 8 is a side cross-sectional view of a flip-leaved vapor drain system embodiment of the present invention.

In some applications, contamination may be quite severe, particularly where the wafers are self-contaminating and therefore, it is critical to remove vapor molecules before they diffuse even once across a wafer. These difficult applications may justify the costs and the disadvantages of using a closely adjacent vapor drain system as shown in FIG. 6, an inter-leaved vapor drain system as shown in FIG. 7, or flip-leaved vapor drain system as shown in FIG. 8 despite the limitations of each respective embodiment.

Figure 9:
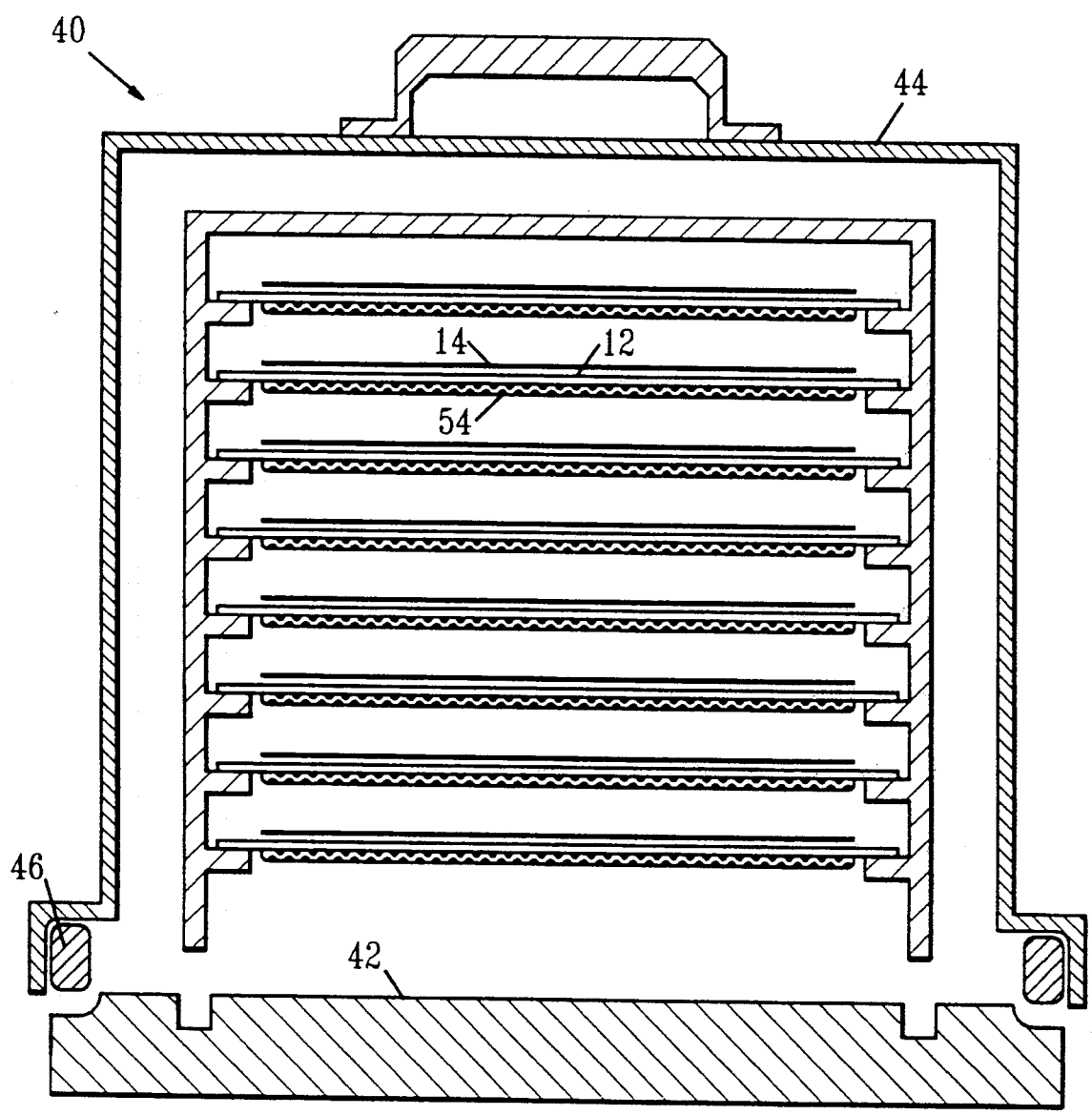
FIG. 9 is a side cross-sectional view of an integrated sheet vapor drain system embodiment of the present invention.

FIG. 9 shows another embodiment of the invention referred to as an integrated sheet vapor drain system global/aero embodiment of the present invention. In this embodiment a sheet vapor removal element 54 (FIG. 4) is integrated with an associated wafer 12. Each wafer 12 has one side which is the sensitive face 14, and the other side is the substrate for a sheet vapor removal element 54. This embodiment removes vapors very much like the inter-leaved vapor drain system shown in FIG. 7. To further avoid dust generation when handling wafers with integrated sheet vapor removal elements, the sheet vapor removal element may have a pattern with locations where the wafer is handled.

The seamless unification between vapor removal element 54 and wafer 12 has advantages since the enclosure capacity is not decreased and there is no need for additional effort or machinery to load/unload the vapor drains. Also, the integrated sheet vapor removal element may be applied, renewed, removed using equipment and techniques already developed to process wafers. In addition, the integrated sheet vapor removal element may be permanent, temporary or renewable during wafer processing. Moreover, multiple integrated sheet vapor removal elements may be applied serially during wafer processing.

Figure 10:
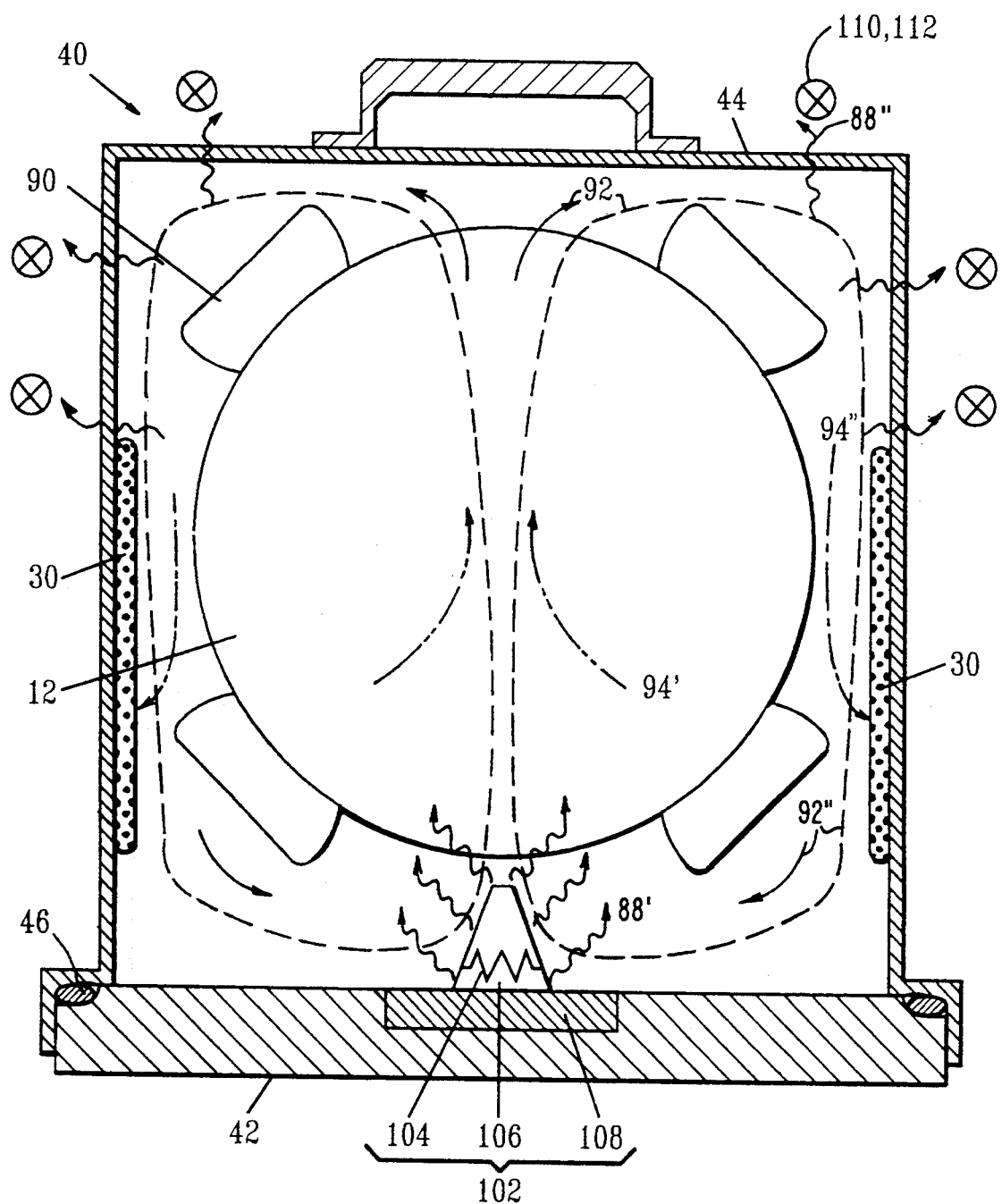
FIG. 10 is a side cross-sectional view of a thermo-buoyant vapor drain system embodiment of the present invention.

FIG. 10 shows the aero/global structure of a thermo-buoyant vapor drain (TBVD) system with vertical wafers which is another embodiment of the present invention. In order to improve vapor conductance, the internal air is non-uniformly heated and cooled which causes density differences, buoyant forces, air circulation, vapor convection, and improved vapor conductance within the enclosure 40.

An enclosure 40 includes a base 42, cover 44, and sealing gasket 46. Wafers 12 are located in substantially parallel vertical planes at sites in a stack. Retainers 90 hold the wafers 12 in a vertical plane. The retainers 90 may be movable or spring loaded to facilitate load/unload and retention of the wafers. There is at least one vapor removal element 30 inside the enclosure 40, typically located on an inside wall of the cover 44.

A heater 102 warms air inside the pod 40, near the bottom of the enclosure. As an example, an electrical resistance heater 104, is attached to a thermally conductive vane 106 which rests upon a thermal insulator 108 in the base 42. In addition, cooling means 110 located near the top of the enclosure cools the air inside the enclosure. An example of the cooling means is a heat transfer from the warmer air inside the enclosure, through the cover 44 to cooler external air 112. Heating and cooling are graphically represented respectively by arrows 88' and 88".

Temperature differences inside the pod cause air density differences, which result in buoyant forces, which create air circulation as indicated by arrows 92' and 92". The enclosure may include means for guiding circulation. The vane 104 facilitates air heating and aims circulation at the center of the wafer. Also the retainers 90 obstruct some unwanted modes of buoyant circulation.

Any vapors near the wafer 12 are convected away by circulation 92' to the vicinity of the vapor removal element 30 where the vapors are absorbed. The vapor transfer is represented by arrows 94' and 94". Vapor-depleted air circulates back to the wafer 12. Although one air cycle may remove only a fraction of the vapor, nevertheless repeated air cycles iteratively remove vapor, which leads to a steady state condition with low vapor concentration. Thus, iterated vapor convection enhances vapor conductance from wafer 12 to vapor removal element 30 which makes this embodiment particularly suitable for self-contaminated wafers.

It will be apparent to those skilled in the art that variations and modifications are possible. For example, there are various devices useful for heating air inside the enclosure. The power to heat the air may be supplied from an external electrical source, or from an internal electrical battery, or from a thermal reservoir. A heater may be inboard of the base, integral with the base, or outboard of the base or inboard, integral or outboard of the cover. Yet another embodiment for the heater uses an external source of radiant energy, which passes through a radiation-transparent window into the cover, where it is absorbed by an internal component which generates heat. For example, in the apparatus shown in FIG. 10 and the modified embodiment shown in FIG. 11 an electrical resistor is used to heat the vane 106. The heater may include thermal fins or turning vanes. Each alternative implies the inclusion of corresponding thermal conductors and insulators. An external heater may be used to radiate energy through the cover into the pod. There are various methods of cooling, including: thermal fins outside the enclosure (such as a metal handle 110), thermal conductors penetrating into the enclosure (such as metal rivets through the lid), or thermal fins inside the enclosure. The cooling may be accomplished with cool external air, or with a fluid-cooled metal plate.

Figure 11:
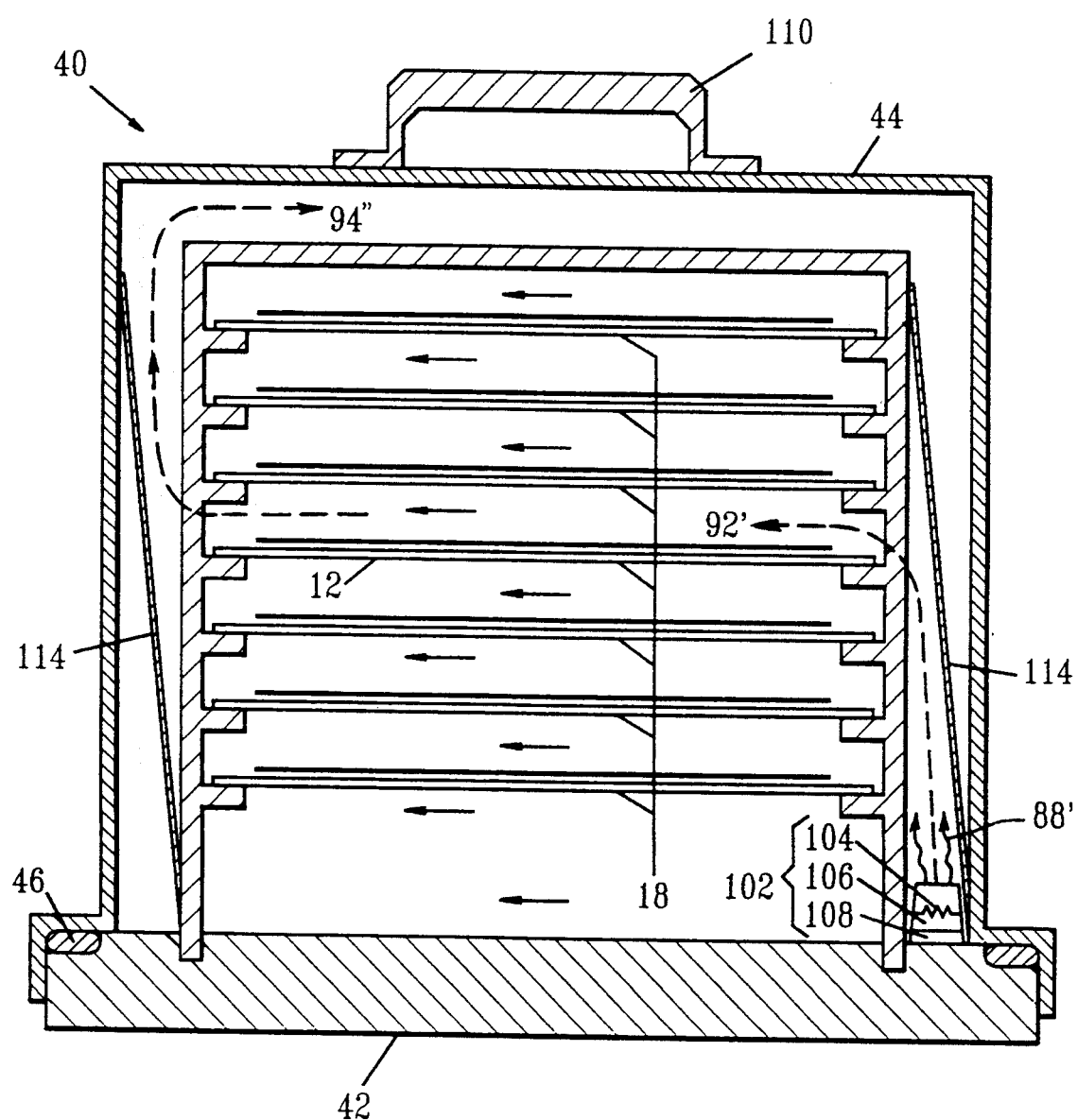
FIG. 11 is a side cross-sectional view of another thermo-buoyant vapor drain system embodiment of the present invention.
Figure 12:
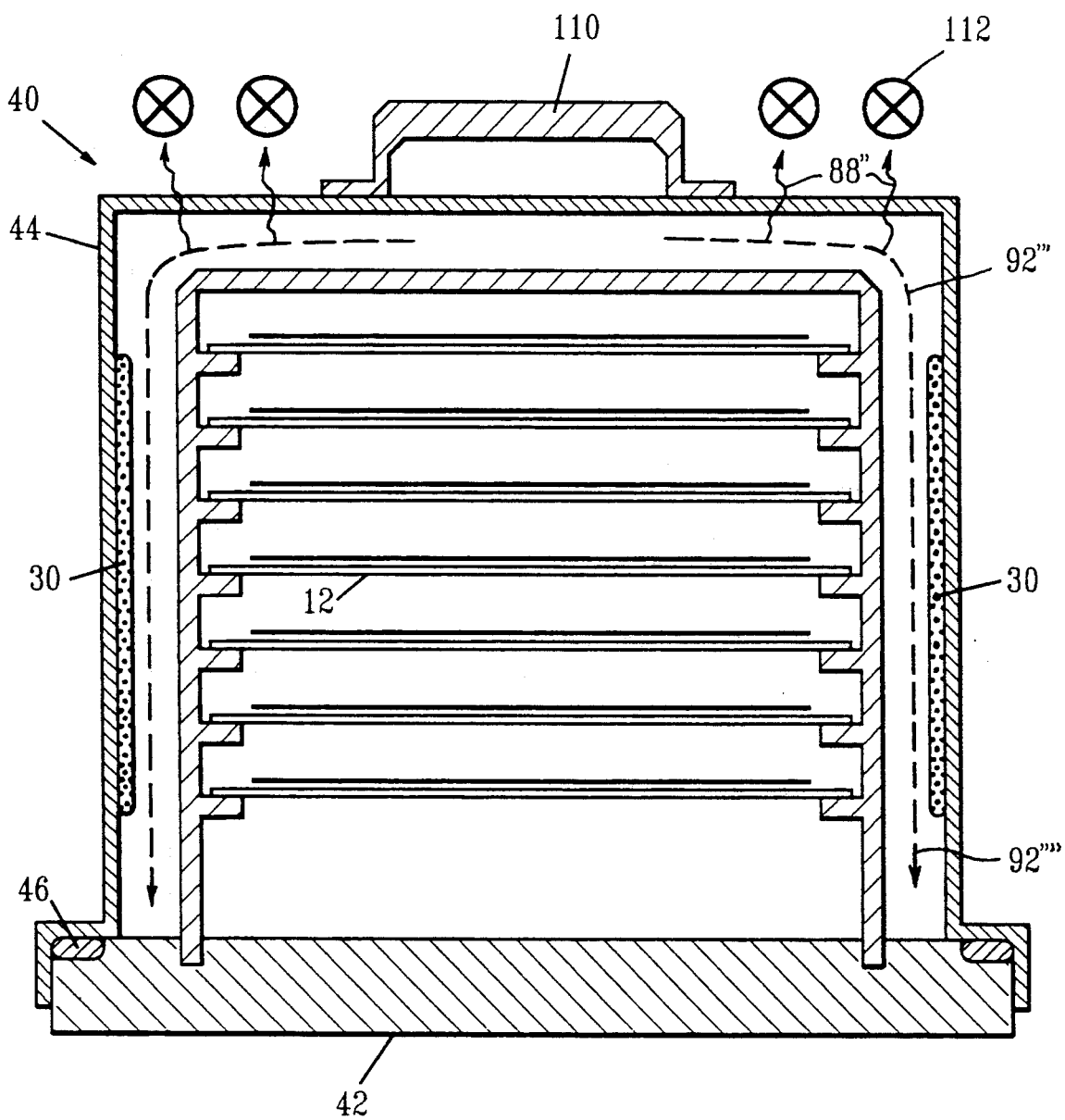
FIG. 12 is a front cross-sectional view of the thermo-buoyant vapor drain system embodiment shown in FIG. 11.

FIG. 11 and FIG. 12 are two orthogonally oriented view of a single embodiment of the present invention. As shown in FIG. 11, there is a SMIF Pod 40 having a base 42, cover 44, and horizontal wafers 12 in a vertical stack 18. Heater 102 located near the bottom of the pod warms the air inside the pod as described above. In addition, there are air deflectors 114. As shown in FIG. 12, cooling means 110 near the top of the SMIF pod cools the air inside the SMIF pod. For example, heat is transferred from the warmer air inside the pod, through the cover 44, to the cooler external air 112. Heating and cooling are represented respectively by arrows 88' and 88" in FIGS. 11 and 12.

Temperature differences cause air density differences, which result in buoyant forces, which causes air circulation as shown by arrows 92'" and 92"". Air deflectors 114 guide the circulation over the horizontal wafers 12. In addition, the deflectors 114 obstruct some unwanted modes of buoyant circulation through the enclosure.

As best seen in FIG. 12, there is at least one vapor removal element 30 located on the inner wall of the cover 44. Any vapors near the the wafer 12 are convected away by circulation 92'" and 92"" to the vicinity of the vapor removal element 30 where the vapors are absorbed. Vapor-depleted air circulates back to the wafer 12. Additional vapor removal elements 30 may be located on other inside walls of the cover 44.

It is also possible to use an enclosure and global vapor removal elements as described above where heaters and coolers are located at opposite walls of the cover 44. During storage, the enclosure is tipped sideways thereby creating, in effect, a stack of vertical wafers, a heating means on the bottom, and cooling means on the top, with resulting thermo-buoyant circulation, and vapor convection from the wafers to the vapor removal element. When it is necessary to load/unload the wafers, the enclosure is tipped upright. The wafers are then horizontal, which allows the use of standard load-/unload machines and procedures.

The thermal buoyant vapor drain system arrangements enhance vapor conductance from the stack of wafers to a distant vapor drain, and facilitates wafer load/unload to various degrees. Also, the entire enclosure capacity is useable. Moreover the use of a fan, blower or external air connection is obviated. Considering these features, if the predominant vapor source is located on the wafers, and if the source has significant strength, then a thermal buoyant vapor drain is the preferred embodiment. Although a low power heat source and cool air source are needed, these are often easily provided.

Under certain circumstances it is advantageous to include a fan or blower in order to force air circulation inside the pod to enable more aggressive vapor absorption and/or more aggressive particulate filtration. In special cases, the additional cost and complexity is justified. First, very aggressive particulate filtration may itself justify a fan or blower. Second, very severe vapor sources may demand very high conductance, which the simpler embodiments cannot provide.

Figure 13:
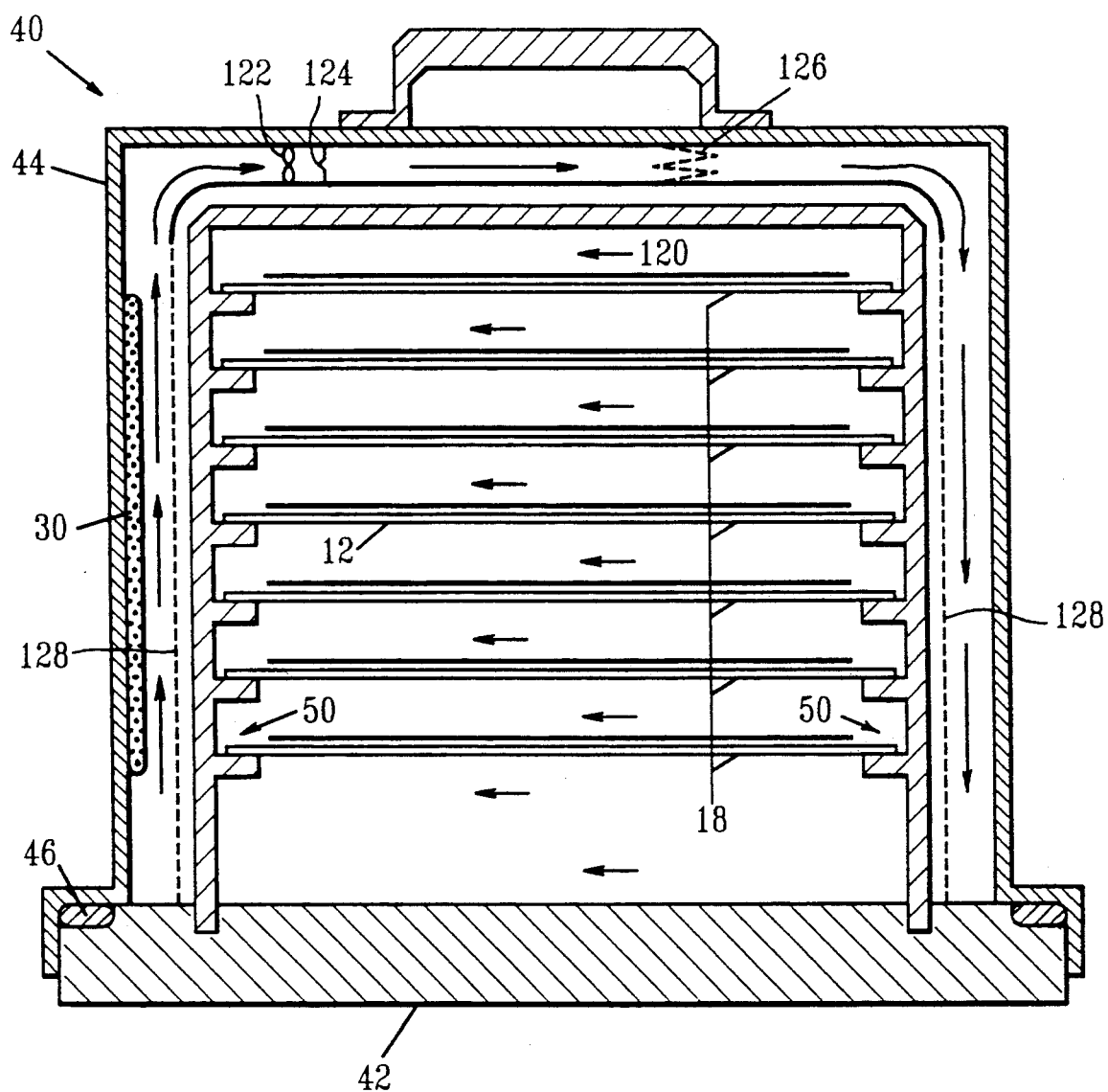
FIG. 13 is a side cross-sectional view of a flow past vapor drain system embodiment of the present invention.

FIG. 13 shows a flow past vapor drain system embodiment of the present invention. The SMIF pod 40 is generally similar to that described above. In addition, inside the pod there is forced air circulation shown by arrow 120. There is an air mover 122 such as a fan or blower. The arrangement may include one or more of a particulate filter 126, an air duct 124 or an air guide 128, such as a diffuser or vanes, to guide the air flow among the wafers 2 in the stack. There is at least one vapor removal element 30 located on an inside wall of the cover 44. Locating the vapor removal element 30 as shown has rapid air flow and does not exclude a wafer from any site 50. However, the vapor removal element can be disposed at other locations inside the enclosure.

In the embodiment shown, when the air mover 122 is operating, air flows in a cycle: through the air mover 122, through the air duct 124, through the particulate filter 126, past the air guide 128, among the wafers 12, past the vapor removal element 30, and back to the air mover 122.

Air circulation facilitates vapor absorption and particulate filtration in several ways. First, small capacity can be quite adequate for the vapor removal element 30 and for the particulate filter 126. Even though the integrated air flow is extremely large, the total amount of air to clean is quite small. Second, circular flow can achieve air which is very vapor-clean and particulate-clean, even with very low removal efficiency per air cycle for the vapor removal element 30 and particulate filter 126, even with a wafer 12 at every site 50. For example, assume the source emits enough vapor to raise the relative vapor concentration (RVC) from 0%, to 50%, in one hour in the absence of a vapor drain. If the vapor drain system removes merely 1/20 of the vapor during each air pass, and there are 10 air passes per minute, then with both a source and a vapor drain, there will be a steady state with relative vapor concentration of only 0.3%. Fourth, low efficiency for the particulate filter enables ample flow with low air pressure. Fifth, aerodynamics theory teaches the concept of a boundary layer. Since air flows rapidly past the vapor drain, the adjacent boundary layer will be thin, which facilitates the vapor drain conductance.

Figure 14:
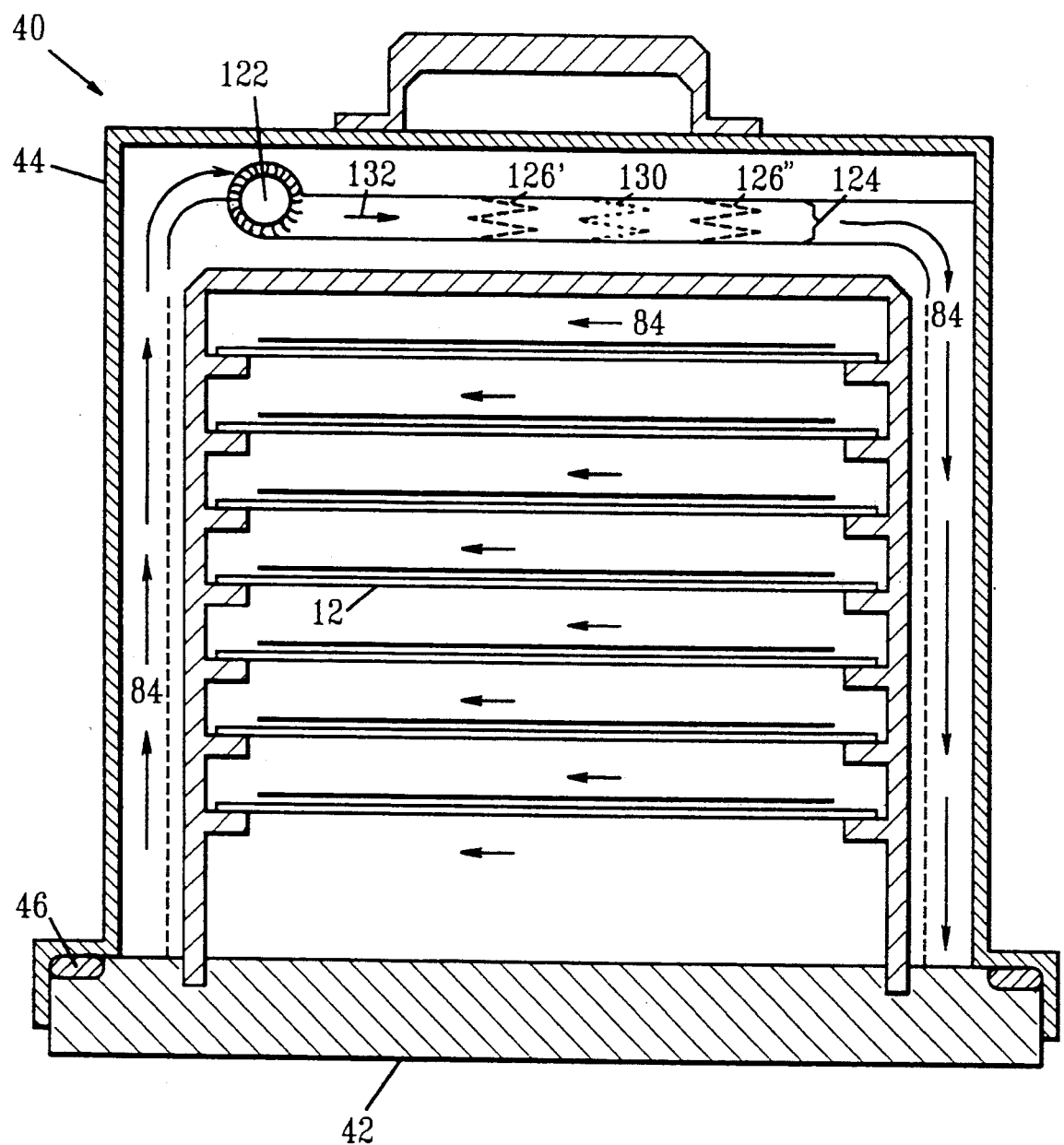
FIG. 14 is a side cross-sectional view of a flow through vapor drain system embodiment of the present invention.

FIG. 14 illustrates a "flow through" vapor drain system embodiment of the present invention. This embodiment is generally similar to the embodiment described in FIG. 13. However, in FIG. 14 the vapor removal element 130 is porous and located across the duct 124, where air flows through the vapor removal element 130 in the direction of arrow 132. In order to minimize the pressure drop, the vapor removal element 130 may have a very low efficiency per air cycle to absorb vapor. An example is a vapor removal element with an absorber of activated carbon, with especially low density and large porosity. Also in order to minimize the pressure drop, the particulate filters 126' and 126" may have very low efficiency per air cycle to filter out particulates. An example is a particulate filter with HEPA material with especially low density and large pores. Moreover, in order to minimize the pressure versus flow, the vapor removal element 130 and particulate filters 126' and 126" may be pleated to increase the flow area within a compact volume. In this embodiment, it may be convenient to partly or fully unify the vapor removal element 130 and particulate filters 126' and 126". The particulate filters 126' and 126" surround the vapor removal element 130 and thus provides a barrier layer in a manner equivalent to absorber layer 32 shown in FIG. 3. For more unification, the filter material and absorber material may be placed together before pleating. Nevertheless, in FIG. 14 these elements are shown well separated for graphical clarity.

Thus a flow through vapor drain system embodiment uses considerable air pressure to enable penetrating flow through a vapor removal element and a particulate filter which allows very aggressive absorption and particulate filtration, but with significant cost and complexity.

In some rare instances, the external air is chemically cleaner than the air inside a sealed enclosure. In such instances, a relevant embodiment is a "leaker" vapor drain system. This embodiment includes an aperture in a wall of the pod, and the aperture is covered by a barrier which is vapor-permeable but particulate-blocking. The material used is of the type described in relation to the barrier layer 34 in FIG. 3. Thus the vapor removal element is formed by the barrier and aperture, and operates by vapor diffusion outward from interior air to external air. The global/aero structure is an aperture covered by an anti-dust barrier. This embodiment can be very simple and inexpensive, and counteracts moderate internal vapor sources. This embodiment works only if the exterior air is vapor clean. However, this embodiment does not counteract external vapor sources, so the embodiment is vulnerable to unexpected changes in the vapor concentration of the external air. The vulnerability can be corrected by adding a vapor absorber, as described below concerning the breather vapor drain system embodiment.

Figure 15:
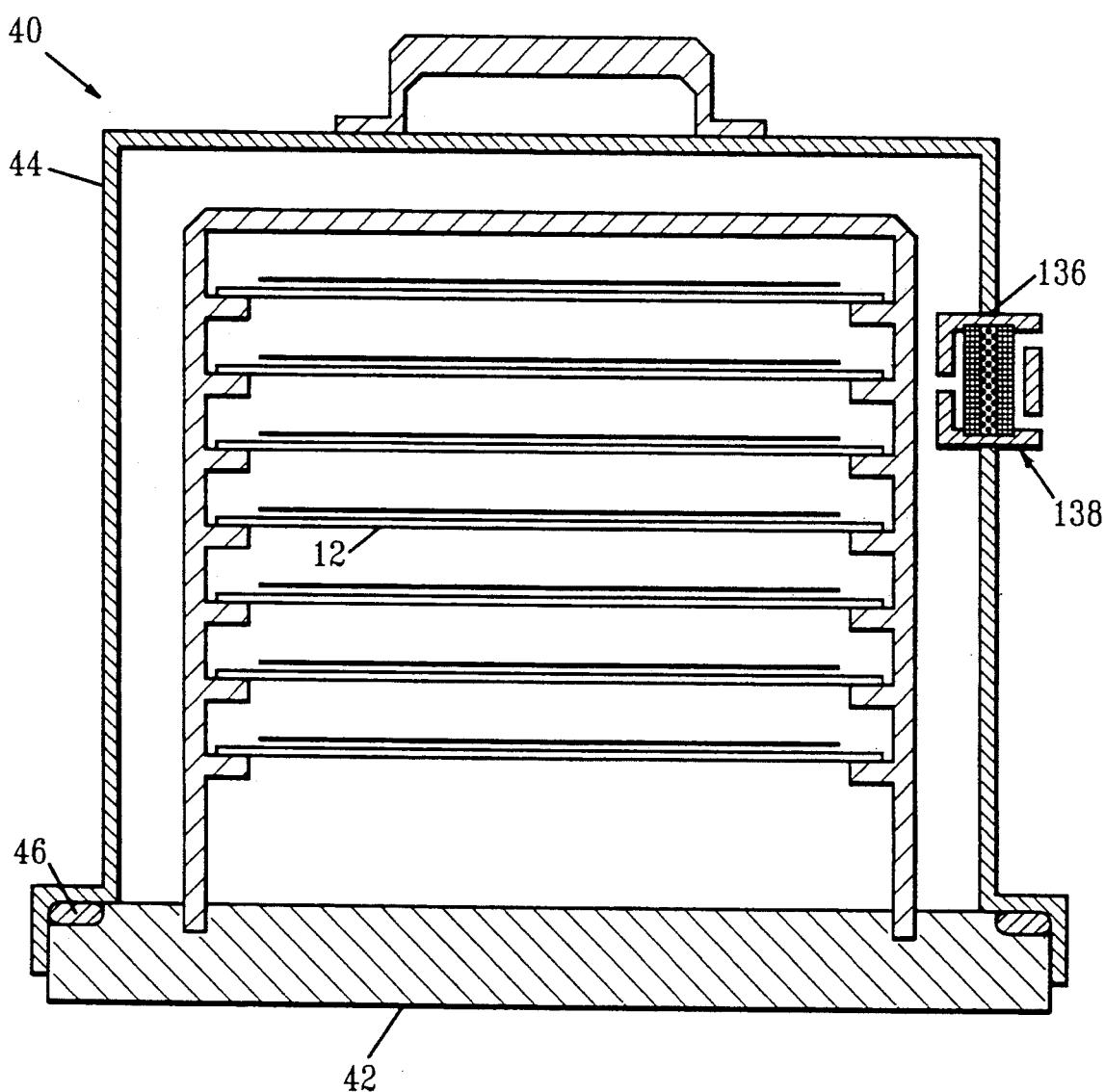
FIG. 15 is a side cross-sectional view of a breather vapor drain system embodiment of the present invention.

As a result of barometric and thermal cycles, it is difficult to maintain an enclosure perfectly sealed by using a gasket which is perfectly seated, a cover which is absolutely rigid and constant temperature and pressure. If significant effort achieves a perfect seal, then pressure differences complicate opening of the enclosure. Instead, an enclosure tends to "breathe", that is, to exchange air inside and outside the enclosure during barometric and thermal cycles. The air exchange can contaminate the enclosure by carrying vapors from outside to inside the enclosure. This can be prevented by use of a "breather" vapor drain system, which typically includes both a breather global/aero structure, and a breather vapor removal element. The breather global/aero structure provides a vapor removal element located across an aperture where internal and external air can be exchanged such as shown in FIG. 15. The breather vapor removal element provides at least two ports so air can penetrate through the element and provides for removal of vapor from the penetrating air, such as shown in FIG. 16.

In order to preclude vapor contamination caused by breathing in FIG. 15, there is shown a breather vapor drain system embodiment of the present invention. A SMIF pod 40 has a cover 44, with an aperture 136. A breather vapor removal element 138 is located across the aperture 136. Internal air and external air can be exchanged, but any vapors will be absorbed by the breather vapor removal element.

Figure 16:
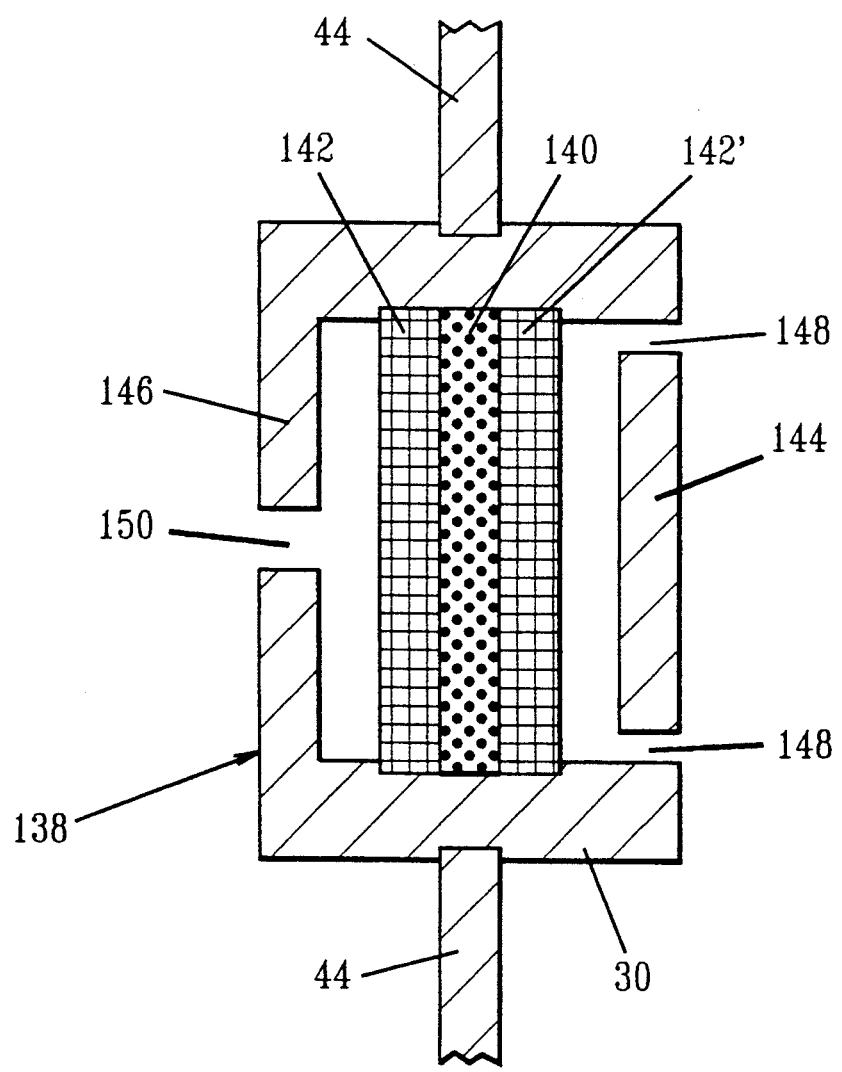
FIG. 16 is an enlarged cross-sectional view of the vapor removal element shown in FIG. 15.

The internal structure of the vapor removal element 138 is shown in FIG. 16. For graphical clarity, the layer thickness is considerably exaggerated in FIGS. 15, 16 and 17. At the center of the vapor removal element 138 is an absorber layer 140 surrounded by barrier layers 142 and 142', surrounded by guard plates 144. The guard plates includes air channels 148 and 150 respectively. The barrier layers are typically HEPA particulate filter material. The vapor removal element 138 is located across the aperture 136 in the cover 44. The structure, function and construction of vapor removal element generally is analogous to that described above in conjunction with the vapor removal element shown in FIG. 3. However, the absorber 140 and barriers layers 142 and 142' are designed with sufficient capacity for the integrated flux of vapor and particulates. Also the air channels 148 and 150 are optimized for vapor transport by air flow through the vapor removal element. In contrast, the embodiment shown in FIG. 3 is optimized for vapor movement by diffusion, without microscopic air flow penetrating the vapor removal element.

Figure 17:
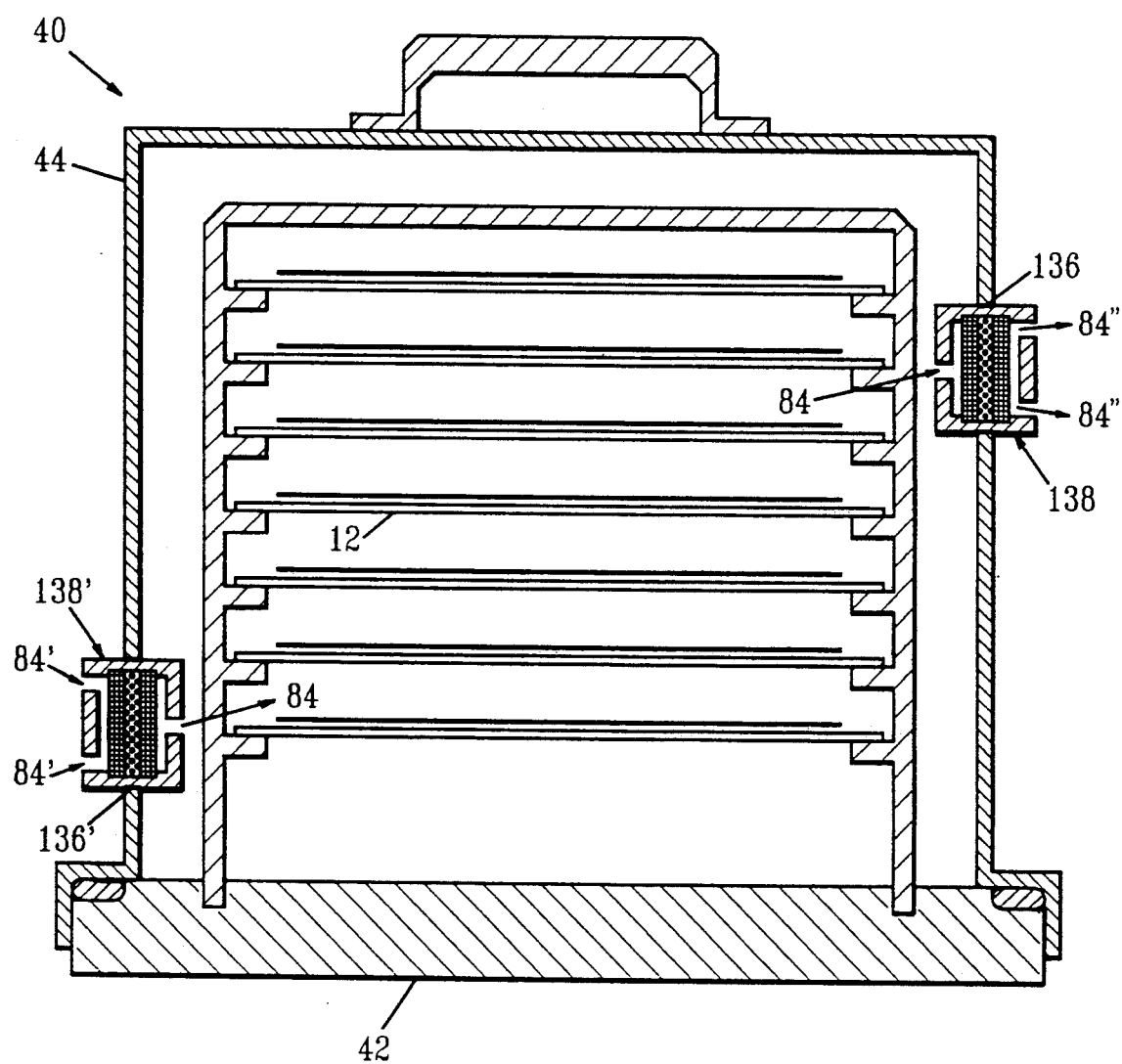
FIG. 17 is a side cross-sectional view of a purged vapor drain system embodiment of the present invention.

FIG. 17 shows a global/aero structure for an embodiment of the present invention referred to as a purged vapor drain system. There is a SMIF Pod 40 as described above. However, a cover 44 has two or more apertures 136 and 136', each aperture is covered by a respective vapor removal element 138 and 138'. There is means (not shown), such as an air line or fan, for forcing external air into the pod 40 through one vapor removal element 136'. Vapor removal element 136' absorbs any incoming external vapor. Inside the pod 40, air is displaced, and flows out through a second vapor removal element 136. When the normal air flow is interrupted, the purged vapor drain arrangement in FIG. 17 acts as a breather vapor drain system of the type show in FIG. 15 so that external vapors cannot enter the enclosure. The internal structure of each vapor removal elements 136 and 136' is as described above in conjunction with FIG. 16. However, the absorber 140 and barrier layers 142 and 142' may be further enlarged to hold the larger integrated flux of vapor and particulates and the larger flow of air. In some cases, the absorber and barrier layers may be pleated to provide large vapor-removal capacity in a small volume.

Still further embodiments of the present invention are possible. For example, the vapor removal element can be a chemical sampling device. After prolonged use, the absorber contains accumulated vapors which can be removed and chemically analyzed. For this embodiment, it is preferable to use as a reversible absorber an absorber material which facilitates chemical extraction and analysis of trapped contamination. One example is Tenax brand polymeric absorber, which is often used for environmental air sampling and gas chromatography. The vapor removal element can be removed from the enclosure, heated to desorb any contamination, which is analyzed in a chromatograph. Since any contamination is removed from the vapor removal element, therefore the element is "regenerated", and the vapor removal element can be reused in an enclosure. Thus a vapor drain sampler system can be used to identify and quantitatively measure vapors, leading to elimination of their sources.

In some manufacturing enclosures, it is desirable to maintain the vapor concentration of a particular chemical vapor agent. Two examples are anti-electro-static agents, or anti-corrosion agents. Therefore a material which includes an ample supply of the desired chemical is added to the enclosure which then acts as a vapor reservoir. When the vapor reservoir is used in combination with a vapor drain, the result is a steady state vapor concentration. Such a system used in conjunction with a disk drive is described, for example, in pending U.S. patent application Ser. No. 535,269 filed May 24, 1990, assigned to the same assignee as the present invention.

While there has been described and illustrated several preferred embodiments of the present invention, it will be apparent to those skilled in the art that variations and modifications are possible without deviating from the broad scope of the present invention which shall be limited solely by the scope of the claims appended hereto.

What is claimed is:

1. A vapor drain system comprising:
    an enclosure for holding a vapor sensitive product between processing steps of its manufacture; and
    vapor removal element means disposed in said enclosure for removing contaminating vapors outgassing from a source within said enclosure, the conductance of said vapor removal element sufficiently exceeding the conductance of said source of contaminating vapors to maintain the relative vapor concentration (RVC) of said contaminating vapors in said enclosure at ten percent (10%) or less adjacent the vapor sensitive product to thereby inhibit the formation of contaminating layers on said product.

2. A vapor drain system as set forth in claim 1, wherein said enclosure comprises a cover having a plurality walls and said vapor removal element means is disposed at at least one of said walls.

3. A vapor drain system as set forth in claim 2, further including means not part of the vapor sensitive product for circulating vapor past said vapor removal element means.

4. A vapor drain system as set forth in claim 1 wherein said enclosure holds a plurality wafer shaped products arranged in a stack in face to face to face spaced relationship to one another and said vapor removal element means comprises a plurality of vapor removal element means, with individual ones of said vapor removal element means each interposed between a different pair of said wafer shaped products in the stack.

5. A vapor drain system as set forth in claim 4 wherein said vapor removal element means is disposed on a face of individual wafer shaped products in said plurality.

6. A vapor drain system as set forth in claim 4 further including means not part of the vapor sensitive product for circulating vapors to the vicinity of said vapor removal element means.

7. A vapor drain system as set forth in claim 1, wherein said enclosure comprises a plurality of walls and said vapor removal element means comprises a breather vapor removal element disposed across an aperture in one of said walls.

8. A vapor drain system as set forth in claim 1, wherein said enclosure comprises a plurality of walls and said vapor removal element means comprises a first breather vapor removal element across an aperture in one of said walls and a second breather vapor removal element across an aperture in another of said walls for providing purging of the atmosphere within said enclosure.

9. A vapor drain system as set forth in claim 1, wherein said vapor removal element is removable and comprises an absorber for facilitating analysis of said vapors.

10. A vapor drain system an set forth in claim 9, wherein said absorber is a reversible absorber.

11. A vapor drain system as set forth in claim 9, wherein said enclosure comprises a plurality of walls and said vapor removal means is disposed in an aperture in one of said walls.

12. A vapor drain system as set forth in claim 1, wherein said vapor removal element comprises an aperture connecting the interior and exterior of said enclosure and a vapor-permeable and particulate-proof barrier disposed across said aperture.

13. A thermo-buoyant vapor drain system comprising:
    an enclosure for holding vapor sensitive product between steps of its manufacture;
    means not part of the vapor sensitive product for non-uniformly heating and cooling air within said enclosure for causing thermo-buoyant convection of vapor within said enclosure, and
    vapor removal element means disposed in said enclosure for removing vapor from said circulating air.

14. A thermo-buoyant vapor drain system as set forth in claim 13, wherein said means for non-uniformly heating and cooling comprises a heat source located within said enclosure.

15. A thermo-buoyant vapor drain system as set forth in claim 13, wherein said means for non-uniformly heating and cooling comprises a heat source disposed external to said enclosure and means for transferring heat non-uniformly to air in said enclosure.

16. A thermo-buoyant vapor drain system as set forth in claim 13, wherein said means for non-uniformly heating and cooling comprises at least one thermal fin located on a wall of said enclosure.

17. A thermo-buoyant vapor drain system as set forth in claim 13, wherein said means for non-uniformly heating and cooling comprises at least one thermal conductor passing through a wall of said enclosure.

18. A thermo-buoyant vapor drain system as set forth in claim 13, wherein said means for non-uniformly heating and cooling comprises a fluid cooled thermal plate.

19. A thermo-buoyant vapor drain system as set forth in claim 13, wherein said enclosure comprises a plurality of walls and said vapor removal element means is disposed at at least one of said walls.

20. In a sealed enclosure for retaining a semi-conductor wafer with a sensitive face between manufacturing steps for said wafer, the improvement comprising:
    a vapor removal element with a conductance which exceeds the sum of the conductances from all sources of contaminating vapor in the enclosure including those of the wafer itself, said vapor removal element being held in close juxta-position to the sensitive face of the wafer so as to capture vapor emissions from said face to thereby protect the sensitive face of the wafer from formation of contaminating films thereon.

21. The sealed enclosure of claim 20 wherein said vapor removal element includes vapor removal material enclosed in a porous particulate blocking film.

22. The sealed enclosure of claim 20 wherein said conductance of said vapor removal element is sufficient to maintain the relative vapor concentration (RVC) within the enclosure at ten percent (10%) or less where RVC=

$$\frac{\left[\frac{W}{G.Travel} + \frac{1}{G.Drain}\right]}{\left[\frac{1}{G.Source} + \frac{1}{G.Travel} + \frac{1}{G.Drain}\right]}.$$

23. In a sealed enclosure with a rack mounted therein for holding wafers with a sensitive face in a stack with their faces in spaced relationship to each other, the improvement comprising:
    vapor removal elements in the spaces between the wafers facing the sensitive face of the wafers to inhibit self-contamination of the sensitive face of the wafers by outgassing of sources on the wafers.

24. The sealed enclosure of claim 23 wherein the space between the sensitive face of the wafers and the vapor removal elements is 8 mm or less.

* * * * *